(12) United States Patent
Thorbeck et al.

(10) Patent No.: US 12,738,910 B2
(45) Date of Patent: Sep. 15, 2026

(54) VARIABLE IMPEDANCE JOSEPHSON JUNCTION TRAVELING-WAVE PARAMETRIC CIRCUITS

(71) Applicant: International Business Machines Corporation, Armonk, NY (US)

(72) Inventors: Ted Thorbeck, Elmsford, NY (US); Corrado P Mancini, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 460 days.

(21) Appl. No.: 18/238,667

(22) Filed: Aug. 28, 2023

(65) Prior Publication Data

US 2025/0080073 A1 Mar. 6, 2025

(51) Int. Cl.
*H03F 19/00* (2006.01)
*H10N 60/12* (2023.01)
*G06N 10/40* (2022.01)

(52) U.S. Cl.
CPC ............ *H03F 19/00* (2013.01); *H10N 60/12* (2023.02); *G06N 10/40* (2022.01)

(58) Field of Classification Search
CPC ......... H03F 19/00; H10N 60/12; G06N 10/40
USPC ........................................................ 330/286
See application file for complete search history.

(56) References Cited

U.S. PATENT DOCUMENTS 4,132,956 A * 1/1979 Russer .................... H03F 19/00 505/855
7,142,052 B2 11/2006 Zelley
8,861,619 B2 10/2014 McDermott et al.
8,878,626 B2 11/2014 Zmuidzinas et al.
9,793,913 B2 10/2017 Bulzacchelli et al.
10,491,178 B2 11/2019 Naaman et al.
10,725,131 B2 7/2020 Clerk et al.
10,740,688 B2 * 8/2020 Selvanayagam ....... G06N 10/20
10,873,302 B2 * 12/2020 Tan .......................... H03F 7/02
(Continued)

FOREIGN PATENT DOCUMENTS

AU 2020324398 B2 * 2/2024 ............ H03F 19/00
CA 3125824 A1 7/2020
(Continued)

OTHER PUBLICATIONS

V. Gaydamachenko et al., "Numerical Analysis Of A Three-Wave-Mixing Josephson Traveling-wave Parametric Amplifier with Engineered Dispersion Loadings", Cornell University Library, arXiv:2209.11052v2, Nov. 29, 2022, pp. 1-11.
(Continued)

*Primary Examiner* — Hafizur Rahman
(74) *Attorney, Agent, or Firm* — Samuel Waldbaum; Ryan, Mason & Lewis, LLP

(57) ABSTRACT

A device comprises a Josephson junction traveling-wave parametric circuit. The Josephson junction traveling-wave parametric circuit comprises unit cells which are coupled in series to form a transmission line between an input port and an output port. Each unit cell comprises a series Josephson junction, and a capacitor shunted to ground. An impedance of the unit cells is varied along the transmission line to match an input impedance at the input port to an output impedance at the output port, wherein the input impedance and the output impedance are dissimilar.

20 Claims, 8 Drawing Sheets

(56) References Cited

U.S. PATENT DOCUMENTS

| | | | | |
|---|---|---|---|---|
| 10,998,869 | B2 | 5/2021 | Miano et al. | |
| 11,277,107 | B2 | 3/2022 | Bell et al. | |
| 11,515,851 | B2 | 11/2022 | Vesterinen et al. | |
| 11,556,769 | B2 | 1/2023 | Wynn | |
| 11,955,934 | B2 * | 4/2024 | Miano | H03F 7/02 |
| 12,293,255 | B2 * | 5/2025 | O'Brien | H03F 19/00 |
| 12,500,563 | B2 * | 12/2025 | Miano | H03F 7/02 |
| 2009/0219087 | A1 | 9/2009 | Auvray | |
| 2016/0329896 | A1 | 11/2016 | Bronn et al. | |
| 2018/0067182 | A1 | 3/2018 | Clerk et al. | |
| 2018/0285760 | A1 * | 10/2018 | Abdo | H01P 1/213 |
| 2019/0074801 | A1 * | 3/2019 | Tan | H03F 3/54 |
| 2019/0131944 | A1 | 5/2019 | Naaman et al. | |
| 2020/0162047 | A1 | 5/2020 | Bell et al. | |
| 2021/0265963 | A1 | 8/2021 | Kong | |
| 2021/0265964 | A1 | 8/2021 | Miano et al. | |
| 2022/0021362 | A1 | 1/2022 | Roch et al. | |
| 2022/0094320 | A1 | 3/2022 | Vesterinen et al. | |
| 2022/0190798 | A1 | 6/2022 | Mancini et al. | |
| 2022/0311400 | A1 | 9/2022 | White et al. | |
| 2022/0360240 | A1 | 11/2022 | Abdo | |
| 2024/0160975 | A1 * | 5/2024 | O'Brien | G06N 10/00 |
| 2025/0015472 | A1 * | 1/2025 | Kamal | H01P 3/003 |

FOREIGN PATENT DOCUMENTS

| | | | | | |
|---|---|---|---|---|---|
| CN | 113242027 | B | * | 7/2024 | H03F 7/00 |
| WO | 2021026070 | A1 | | 2/2021 | |
| WO | 2021214383 | A1 | | 10/2021 | |

OTHER PUBLICATIONS

A. Miano et al., "Symmetric Traveling Wave Parametric Amplifier", Cornell University Library, arXiv:1811.02703v2, Apr. 21, 2019, pp. 1-6.

A. F. Roudsari et al., "Three-Wave Mixing Traveling-Wave Parametric Amplifier with Periodic Variation of the Circuit Parameters", Cornell University Library, arXiv:2209.07551v1, Sep. 15, 2022, pp. 1-6.

K. Ratter et al., "A Dispersion-Engineered Josephson Travelling Wave Parametric Amplifier with Periodic Impedance Perturbation", 31st International Symposium of Space Terahertz Technology, Mar. 8-11, 2020, 4 pages.

H. R. Nilsson et al., "High-Gain Traveling-Wave Parametric Amplifier Based On Three-Wave Mixing", Physical Review Applied, Apr. 19, 2023, pp. 044056-1-044056-17, vol. 19, No. 4.

K. O'Brien et al., "Resonant Phase Matching of Josephson Junction Traveling Wave Parametric Amplifiers," Physical Review Letters, Oct. 10, 2014, pp. 157001-1-157001-5, vol. 113, No. 15.

A. L. Cullen, "A Travelling-Wave Parametric Amplifier," Nature, Feb. 1, 1958, pages , vol. 181, p. 332.

B. H. Eom et al., "A Wideband, Low-Noise Superconducting Amplifier with High Dynamic Range," Cornell University Library, arXiv:1201.2392v1, Jan. 11, 2012, 23 pages.

C. Macklin et al., "A Near-Quantum-Limited Josephson Traveling-wave Parametric Amplifier," Science, Oct. 16, 2015, pp. 307-310, vol. 350, No. 6258.

J. M. Navarro et al., "Optimising the Design of a Broadband Josephson Junction TWPA for Axion Dark Matter Search Experiments," SPIE Photonex Proceedings, Quantum Technology: Driving Commercialisation of an Enabling Science II, Oct. 6, 2021, 10 pages, vol. 11881.

L. Planat et al., "Photonic-Crystal Josephson Traveling-Wave Parametric Amplifier," Physical Review X, Apr. 28, 2020, pp. 021021-1-021021-19, vol. 10, No. 2.

J. Y. Mutus et al., "Strong Environmental Coupling in a Josephson Parametric Amplifier," Applied Physics Letters, Jul. 2, 2014, pp. 263513-1-263513-4, vol. 104, No. 26.

Quantware, "TWPA: Crescendo," https://www.quantware.eu/product/crescendo, Accessed Jun. 13, 2023, 3 pages.

Rigetti & Co., LLC, "Quantum Computing," https://www.rigetti.com/, Accessed Jun. 13, 2023, 15 pages.

M. Sweeny et al., "A Travelling-Wave Parametric Amplifier Utilizing Josephson Junctions," IEEE Transactions on Magnetics, Mar. 1985, pp. 654-655, vol. Mag-21, No. 2.

G. J. Ribeill et al., "Superconducting Low-inductance Undulatory Galvanometer Microwave Amplifier: Theory," Journal of Applied Physics, Nov. 17, 2011, pp. 103901-1-103901-13, vol. 110, No. 10.

* cited by examiner

300

310

500

VARIABLE IMPEDANCE JOSEPHSON JUNCTION TRAVELING-WAVE PARAMETRIC CIRCUITS

BACKGROUND

This disclosure relates generally to quantum computing and, in particular, to quantum-limited amplifiers and frequency converters such as Josephson junctions traveling-wave parametric amplifiers and Josephson junctions traveling-wave frequency converters, for use with superconducting quantum computing systems. A superconducting quantum computing system is implemented using circuit quantum electrodynamics (QED) devices, which utilize the quantum dynamics of electromagnetic fields in superconducting circuits that include superconducting quantum bits, to generate and process quantum information. In general, superconducting quantum bits (qubits) are electronic circuits which are implemented using components such as superconducting tunnel junctions (e.g., Josephson junctions), inductors, and/or capacitors, etc., and which behave as quantum mechanical anharmonic (non-linear) oscillators with quantized states, when cooled to cryogenic temperatures.

The cryogenic hardware that is utilized to construct a quantum computer with superconducting qubits requires a variety of microwave components including microwave couplers, filters, amplifiers, circulators, and isolators. Traditionally, these components are implemented in qubit control and readout signal paths. As the number of qubits that are implemented in a quantum processor increases to hundreds or thousands or more, the integration of these peripheral components in a manner that reduces overall footprint, thermal load, and added noise in the overall system, is a key challenge to scaling. A Josephson traveling-wave parametric amplifier (JTWPA) circuit is a type of superconducting amplifier that is commonly implemented for quantum computing. In general, a JTWPA circuit comprises a nonlinear metamaterial transmission line, with Josephson junctions providing the inductance and the non-linearity. The gain of a JTWPA circuit with dispersion engineering is exponential as a function of length such that a longer JTWPA circuit provides more gain. However, increasing the length of the JTWPA circuit to achieve more gain increases the physical footprint of the device, which is undesirable.

SUMMARY

Exemplary embodiments of the disclosure include techniques for implementing variable impedance Josephson junction traveling-wave parametric circuits such as Josephson traveling-wave parametric amplifier circuits and Josephson traveling-wave frequency converter circuits. For example, an exemplary embodiment includes a device which comprises a Josephson junction traveling-wave parametric circuit comprising unit cells which are coupled in series to form a transmission line between an input port and an output port. Each unit cell comprises a series Josephson junction, and a capacitor shunted to ground. An impedance of the unit cells is varied along the transmission line to match an input impedance at the input port to an output impedance at the output port, wherein the input impedance and the output impedance are dissimilar.

Advantageously, varying the impedance of the unit cells along the non-linear transmission line of the Josephson junction traveling-wave parametric circuit essentially provides embedded impedance matching circuitry within the Josephson junction traveling-wave parametric circuit, to enable impedance transformation between dissimilar input and output impedances at the input and output ports of the Josephson junction traveling-wave parametric circuit and thereby eliminate the need to implement separate impedance matching element(s) in a signal path which comprises the Josephson junction traveling-wave parametric circuit.

In other exemplary embodiments, the Josephson junction traveling-wave parametric circuit comprises a Josephson traveling-wave frequency converter, or a Josephson traveling-wave parametric amplifier circuit.

Another exemplary embodiment includes a device which comprises a Josephson traveling-wave parametric amplifier circuit. The Josephson traveling-wave parametric amplifier circuit comprises unit cells which are coupled in series to form a transmission line between an input port and an output port. Each unit cell comprises a series Josephson junction, and a capacitor shunted to ground. An impedance of the unit cells is varied along the transmission line to cause the transmission line to have an increased effective electrical length compared to an unvaried impedance.

Advantageously, the impedance of the unit cells can be varied along the transmission line of the Josephson traveling-wave parametric amplifier circuit to increase the effective electrical length of the transmission line and thereby increase the gain of the Josephson traveling-wave parametric amplifier circuit, while utilizing a smaller number of unit cells to form the transmission line and achieve a gain that is comparable to a Josephson traveling-wave parametric amplifier circuit having a relatively larger number of unit cells (e.g., about 2 times more unit cells). Therefore, the variable impedance transmission line enables the implementation of a shorter Josephson traveling-wave parametric amplifier circuit (e.g., less amount of unit cells) without sacrificing gain and bandwidth performance.

In another exemplary embodiment, a system comprises a quantum processor comprising quantum bits, and a readout signal path configured to transmit signals that are readout from one or more of the quantum bits of the quantum processor. The readout signal path comprises a Josephson traveling-wave parametric amplifier circuit. The Josephson traveling-wave parametric amplifier circuit comprises unit cells which are coupled in series to form a transmission line between an input port and an output port. Each unit cell comprises a series Josephson junction, and a capacitor shunted to ground. An impedance of the unit cells is varied along the transmission line to cause the transmission line to have an increased effective electrical length compared to an unvaried impedance.

In another exemplary embodiment, as may be combined with the preceding paragraphs, the impedance of successive unit cells along at least a portion of the transmission line is varied exponentially with respect to electrical length.

In another exemplary embodiment, as may be combined with the preceding paragraphs, the impedance of the unit cells is varied along the transmission line by varying a capacitance of the capacitors of the unit cells.

In another exemplary embodiment, as may be combined with the preceding paragraphs, the impedance of the unit cells is varied along the transmission line by varying a critical current of the Josephson junctions of the unit cells.

Other embodiments will be described in the following detailed description of exemplary embodiments, which is to be read in conjunction with the accompanying figures.

DETAILED DESCRIPTION

Figure 1:
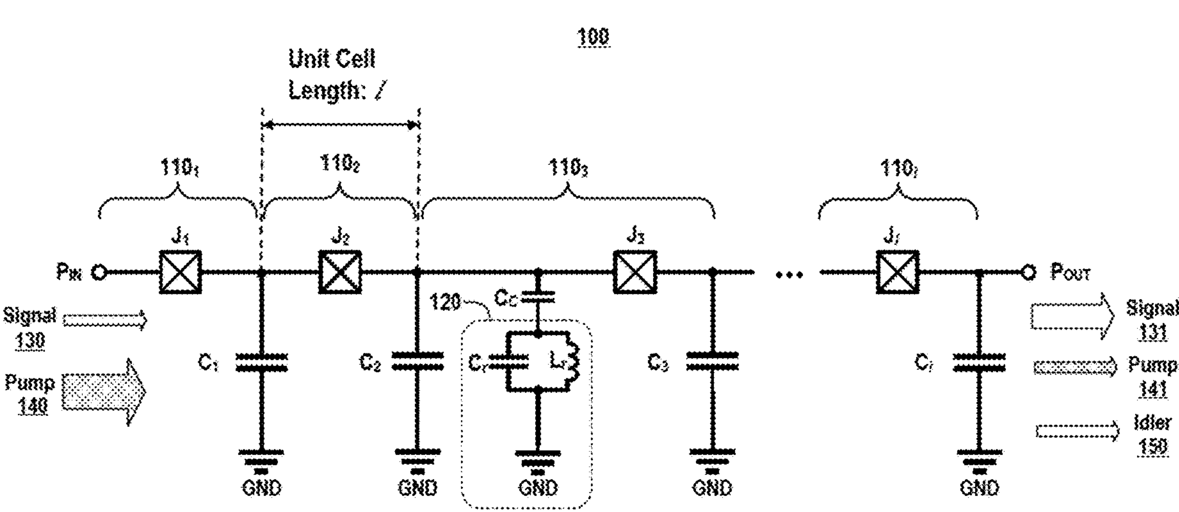
FIG. 1 is a high-level schematic illustration of a Josephson junction traveling-wave parametric circuit, according to an exemplary embodiment of the disclosure.

Exemplary embodiments of the disclosure will now be described in further detail with regard to variable impedance Josephson junction traveling-wave parametric circuits (JJTWPCs) for use with quantum computing systems. More specifically, exemplary embodiments of the disclosure include variable impedance Josephson junction traveling-wave parametric circuits such as Josephson traveling-wave parametric amplifier (JTWPA) circuits/devices, and Josephson traveling-wave frequency converter (JTWFC) circuits/devices, wherein the JTWPA and JTWFC circuits are particular types of JJTWPCs. As explained in further detail below, techniques are provided to implement a variable impedance JJTWPC by varying an impedance of unit cells along a non-linear transmission line of the JJTWPC to provide an impedance transformation between two dissimilar impedances, e.g., impedance transformation between dissimilar input and output impedances at the input and output ports of the JJTWPC. In addition, techniques are provided to implement a variable impedance JJTWPC by varying an impedance of unit cells along a non-linear transmission line of the JJTWPC to increase an effective electrical length of the transmission line and thereby provide a desired amplification with a reduced number of unit cells. Additional techniques are provided to implement a variable impedance JJTWPC by varying the characteristic impedance along a non-linear transmission line of the JJTWPC for matching dissimilar input and output impedances and reducing the number of unit cells of the non-linear transmission line while achieving a desired amplification.

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise quantum circuit elements (e.g., quantum processors, quantum bits, Josephson junction devices, Josephson parametric converters, quantum-limited amplifiers (QLAs), qubit coupler circuitry, etc.), discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

FIG. 1 is a high-level schematic illustration of a Josephson junction traveling-wave parametric circuit, according to an exemplary embodiment of the disclosure. In particular, FIG. 1 schematically illustrates an exemplary architecture of a Josephson traveling-wave parametric amplifier circuit 100 (or JTWPA circuit 100) which can be constructed to have a variable impedance along a non-linear transmission line of the JTWPA circuit 100 to decrease the physical footprint while maintaining a desired gain and/or enabling impedance matching between dissimilar input and output impedances for a given application. The JTWPA circuit 100 comprises an input port $P_{IN}$, an output port $P_{OUT}$, and a non-linear transmission line comprising a series of unit cells 110$_1$, 110$_2$, 110$_3$, . . . , 110$_i$ (collectively, unit cells 110). Each unit cell 110$_1$, 110$_2$, 110$_3$, . . . , 110$_i$ of the non-linear transmission line comprises a respective Josephson junction $J_1$, $J_2$, $J_3$, . . . , $J_i$ and a respective capacitor $C_1$, $C_2$, $C_3$, . . . , $C_i$. The Josephson junctions $J_1$, $J_2$, $J_3$, . . . , $J_i$ are connected in series between the input port $P_{IN}$ and the output port $P_{OUT}$. In each unit cell 110, the respective capacitor $C_1$, $C_2$, $C_3$, . . . , $C_i$ provides a capacitive shunt to a ground GND node, and the respective Josephson junction $J_1$, $J_2$, $J_3$, . . . , $J_i$ provides both inductance and nonlinearity.

In addition, the JTWPA circuit 100 comprises a dispersion element 120 (e.g., dispersion resonator) which is configured to add dispersion along the transmission line so that energy and momentum can be simultaneously conserved during an amplification process. In some embodiments, as shown in FIG. 1, the dispersion element 120 comprises a microwave LC resonator circuit comprising a capacitor $C_r$ and inductor $L_r$ which are connected in parallel, and a coupling capacitor $C_c$ which coupled the LC resonator to the non-linear transmission line of the JTWPA circuit 100. While FIG. 1 shows one dispersion element 120 for ease of illustration, the JTWPA circuit 100 comprises multiple instances of the dispersion element 120 disposed at various points along the non-linear transmission line. For example, in some embodiments, every $n^{th}$ unit cell (e.g., n=3) comprises an instance of the dispersion element 120. The dispersion resonators are configured to maintain phase matching to counteract the phase differences between the different modes that are propagating in the JTWPA circuit 100. Typically, the dispersion elements 120 comprising the LC resonators and associated coupling capacitors $C_c$ are designed to set a desired frequency range to obtain phase matching and counteract the dispersion along the transmission line of the JTWPA circuit 100.

In general, the impedance of the non-linear transmission line of the JTWPA circuit 100 is set by a critical current ($I_C$) of each Josephson junction $J_1$, $J_2$, $J_3$, . . . , $J_i$, and a capacitance (C) to ground GND of each capacitor $C_1$, $C_2$, $C_3$, . . . , $C_i$. As is known in the art, the critical current $I_C$ of a Josephson junction denotes a maximum amount of current that can coherently flow through the Josephson junction, while exhibiting no resistive dissipation, wherein the Josephson junction operates as a nonlinear superconducting inductor when the amount of superconducting current flowing through the Josephson junction is less than the critical current $I_C$. However, when the current flow through the Josephson junction exceeds its critical current $I_C$, the Josephson junction temporarily transitions to a resistive state, which causes a finite voltage to develop across the Josephson junction. As will be explained in further detail below, the critical current $I_C$ places a limit on the amount of pump power that can be utilized in the JTWPA circuit 100.

Furthermore, with a Josephson junction, a resulting superconducting current/which flows through the tunnel junction, and junction voltage V across the tunnel junction, are related to the superconducting phase difference $\varphi=\varphi_1-\varphi_2$ as follows: $I_C \sin \varphi$, and $$V = \frac{\Phi_0 d\varphi}{2\pi\, dt},$$

where $I_C$ denotes the critical current of the tunnel junction, and where $$\Phi_0 = \frac{h}{2e}.$$

The junction critical current is determined by $$I_c = \frac{2eE_J}{\hbar},$$

wherein the junction critical current $I_C$ denotes a maximum amount of current that can coherently tunnel through the junction (exhibiting no dissipation). The junction critical current $I_C$ is a function of the Josephson energy $E_J$ of the Josephson junction, wherein $$E_J = L_{J0} I_C^2,$$

wherein $L_{J0}$ denotes the maximum Josephson inductance of the Josephson junction. Based on the standard relation for inductance $$V = L\left(\frac{dI}{dt}\right),$$

the Josephson inductance $L_J$ is determined as:

$$L_J = \frac{\Phi_0}{2\pi I_c \cos\varphi},$$

which shows that $L_J$ is non-linear with respect to $\varphi$.

Further, a Josephson junction comprises an inductance $L_J$ which is determined as:

$$L_J = \frac{\Phi_0}{2\pi I_C \cos\varphi},$$

where $I_C$ denotes the critical current of the Josephson junction, where $\Phi_0$ denotes the magnetic flux quantum, $$\Phi_0 = \frac{h}{2e},$$

and where $\varphi$ denotes a superconducting phase difference across the Josephson junction, i.e., $\varphi=\varphi_1-\varphi_2$. For a small phase difference across the Josephson junction, the junction inductance $L_J$ can be approximated as $$L_{J0} = \frac{\Phi_0}{2\pi I_C}.$$

Accordingly, the impedance of the non-linear transmission line is approximated as:

$$Z = \sqrt{\frac{L_{J0}}{C}}.$$

Typically, the impedance of the transmission line is set to 50 Ohms on the assumption that the JTWPA circuit 100 is embedded in a 50 Ohm environment. It is to be noted that a Josephson junction has an intrinsic capacitance in parallel to the junction, but such capacitance is small and has a negligible effect on the impedance of the transmission line and, thus, can be ignored in this analysis.

FIG. 1 schematically illustrates an exemplary mode of operation of the JTWPA circuit 100. In particular, FIG. 1 schematically illustrates an input signal 130 and a pump signal 140 that are applied to the input port $P_{IN}$, and a plurality of output signals that are output from the output port Pour including an amplified output signal 131, an output pump signal 141, and an idler signal 150. The input signal 130 comprises a microwave signal having a signal frequency (denoted $f_S$). The pump signal 140 comprises a microwave signal with a pump frequency (denoted $f_P$), which provides power for amplifying the input signal 130 at the signal frequency $f_S$. In some embodiments, a directional coupler is utilized to couple the input signal 130 and the pump signal 140 to the input port $P_{IN}$. The idler signal 150 is a microwave signal having an idler frequency (denoted $f_I$), which is generated as a result of the nonlinear amplification process. For example, for a four-wave mixing process, the idler signal 150 has a frequency $f_I$ which is a function of the input signal frequency $f_S$ and the pump signal frequency $f_P$, as follows: $f_I=2 \cdot f_P-f_S$. In other words, $2f_P=f_I+f_S$.

The JTWPA circuit 100 receives the input signal 130 and the pump signal 140, and amplifies the input signal 130 by taking power from the pump signal 140. For example, in the four-wave mixing process, two pump photons are converted into a new photon at the signal frequency $f_S$ and a new photon at the idler frequency $f_I$. This is schematically shown in FIG. 1, wherein the amplified output signal 131 is represented by an arrow which is thicker than an arrow which represents the input signal 130, and wherein the input pump signal 140 is represented by an arrow which is thicker than an arrow which represents the output pump signal 141.

For the amplification process, both the energy (frequency) and momentum (wavevector) must be conserved in this process such that the following conditions are met: (i) $2\omega_P=\omega_I+\omega_S$, and (ii) $2k_P=k_I+k_S$, wherein $\omega=2\pi f$ denotes the angular frequency (radians per unit time), and wherein k denotes the angular wave vector, which describes how many radians a wave traverses per unit of distance, and has a magnitude (wavenumber) that is determined $$|k| = \frac{2\pi}{\lambda}$$

(with units of $m^{-1}$) where $\lambda$ is the wavelength of the wave in a given medium. In wave propagation, dispersion in the phenomenon in which the phase velocity $v_p$ of a wave depends on its frequency as follows:

$$v_P = \frac{\lambda}{T}$$

where T is a time period, and where $$f = \frac{1}{T}.$$

Equivalently, in terms of the angular frequency $\omega$ and the wave number k, the phase velocity is determined as:

$$v_P = \frac{\omega}{k}.$$

For small signals, the above-noted conditions (i) and (ii) can be simultaneously satisfied. For relatively large pump frequencies, however, a power dependent phase shift is created such that the wave vector condition is no longer satisfied. To simultaneously satisfy both constraints, a resonant phase matching is provided by adding instances of the dispersion element 120 (e.g., dispersion resonator) periodically throughout the transmission line, which serves to alter the dispersion of the transmission line $k(\omega)$ such that both conditions (i) and (ii) are simultaneously satisfied for pump frequencies near the resonant frequency of the dispersion resonator.

The process of engineering a JTWPA circuit with dispersion elements, such as the JTWPA circuit 100 of FIG. 1, involves tradeoffS between parameters such as gain, insertion loss, maximum pump power, and physical size. The gain (amplification) of a JTWPA circuit with dispersion engineering is exponential as a function of length, wherein a longer JTWPA circuit (e.g., more unit cells) provides higher gain. However, the addition of more unit cells in a JTWPA circuit to achieve higher gain results in an increase in the physical footprint of the device, which is not desirable. On the other hand, the electrical length is a parameter that is more important to consider than the physical length of the JTWPA circuit. The electrical length refers to the length of a transmission line as expressed in terms of the phase shift along the transmission line. In particular, the electrical length (denoted $l_e$) can be expressed in terms of wavelengths by dividing the physical length l by the wavelength $\lambda$, i.e., $$l_e = \frac{l}{\lambda}.$$

In this regard, the effective electrical length of a given unit cell (with a given physical length) can be increased by decreasing the wavelength $\lambda$ of the signal.

Exemplary embodiments of the disclosure include techniques for varying the impedance (e.g., tapering impedance) along the transmission line of the JTWPA circuit 100 to effectively reduce the wavelength of the signal frequency and thereby increase the effective electrical length of the JTWPA circuit 100, whereby an increase in the effective electrical length of the JTWPA circuit 100 results in an increase in amplification and achieves a desired gain, while utilizing less unit cells to construct the JTWPA circuit. In some embodiments, the reduction in wavelength is achieved through engineering the L and/or C parameters of the unit cells 110 along the transmission line of the JTWPA circuit 100.

More specifically, in an LC transmission line having an inductance per unit length (denoted L') and a capacitance per unit length (denoted C'), the frequency f and the wavelength λ are related by the phase velocity, $$v_P = \frac{\lambda}{T} = f\lambda = \frac{1}{\sqrt{L'C'}},$$

whereby the wavelength λ can be reduced by reducing the phase velocity $v_p$. The phase velocity Up can be reduced by increasing L' or C' or increasing both L' and C'. The parameters L' or C' are related to the JTWPA parameters as follows:

$$L' = \frac{L_{J0}}{l} = \frac{\Phi_0}{2\pi I_C l} \text{ and } C' = \frac{C}{l}.$$

Therefore, the phase velocity $v_p$ and, thus, the wavelength λ at a given frequency, can be reduced by either (i) increasing L' and C' by reducing the physical length l of the unit cell (which is typically already as small as possible), (ii) increasing L' by reducing the critical current $I_C$ of the Josephson junction per unit cell, or (iii) increasing the capacitance C of the capacitor per unit cell, or by both (ii) and (iii), the details of which will be explained in further detail below.

While the critical current $I_C$ and/or the capacitance C of the Josephson junction and capacitor components of the unit cells 110 are parameters that can be optimized for gain and power saturation, additional consideration is given to ensure that the transmission line impedance, $$Z = \sqrt{\frac{L_{J0}}{C}},$$

will provide the requisite input impedance and output impedance to match to the impedance of the given environment (e.g., 50 Ohm environment) to prevent or otherwise minimize losses due to reflections at the input and output of the JTWPA circuit 100. In this regard, exemplary embodiments of the disclosure include techniques for varying the impedance along the non-linear transmission line of the JTWPA circuit 100 to implement impedance matching circuitry within the JTWPA circuit 100 for purposes of input/output impedance matching, as well as achieving a desired gain/amplification while utilizing a small number of unit cells for constructing the JTWPA circuit 100.

It is to be noted that while exemplary embodiments are discussed in the context of variable impedance JTWPA circuits, the same or similar techniques (as discussed herein) can be utilized to vary the characteristic impedance of the non-linear transmission line of a Josephson traveling-wave frequency converter circuit to, e.g., enable impedance matching between dissimilar input and output impedances at the input and output ports of the Josephson traveling-wave frequency converter circuit. A Josephson traveling-wave frequency converter circuit has an architecture which is substantially the same as to the exemplary architecture of the JTWPA circuit 100 of FIG. 1, but with slight parameter changes and a different pump frequency that is selected to enable frequency conversion, e.g., convert an input signal frequency to an output idler frequency. For example, a Josephson traveling-wave frequency converter circuit can be configured to perform four-wave mixing where the frequency $f_S$ of the input pump signal (e.g., pump signal 140, FIG. 1) and the frequency $f_I$ of the idler signal (e.g., idler signal 150, FIG. 1) have the following relation: $f_I=2\cdot f_P+f_S$, which is slightly different from frequency relationship $f_I=2\cdot f_P-f_S$ of the JTWPA circuit 100. Advantageously, varying an impedance of unit cells along a non-linear transmission line of a Josephson traveling-wave frequency converter circuit to provide an impedance transformation between dissimilar input and output impedances at the input and output ports of the Josephson traveling-wave frequency converter circuit eliminates the need to implement separate impedance matching element(s) in a signal path which comprises the Josephson traveling-wave frequency converter circuit.

Figure 2A:
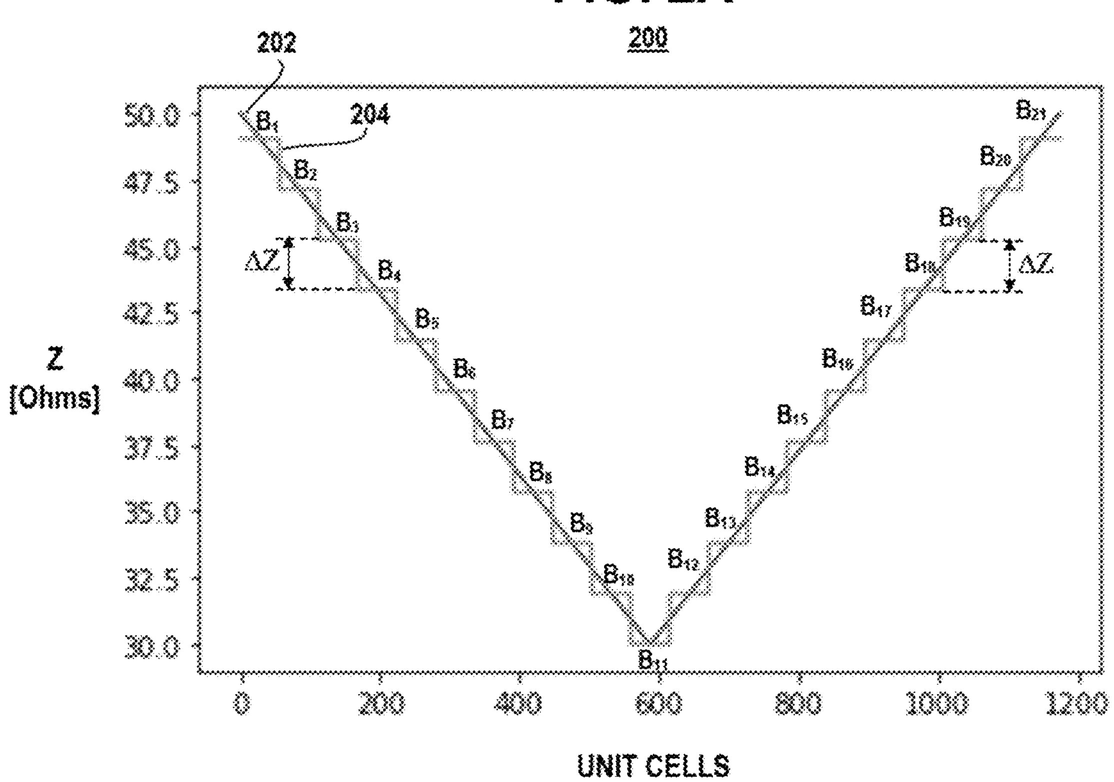
FIG. 2A illustrates techniques for varying an impedance over a plurality of unit cells of a transmission line of a Josephson traveling-wave parametric amplifier circuit, according to an exemplary embodiment of the disclosure.

In some embodiments, as noted above, the impedance can be varied along the non-linear transmission line of the JTWPA circuit 100 by varying the capacitance C of the capacitors of the unit cells 110 using exemplary techniques such as unit cells illustrated by FIGS. 2A, 2B, 3A, 3B, 4A, and 4B. For example, FIG. 2A illustrates techniques for varying an impedance over a plurality of unit cells of a transmission line of a JTWPA circuit, according to an exemplary embodiment of the disclosure. In particular, FIG. 2A illustrates variable impedance profiles 200 for varying the capacitance unit cells to vary the impedance Z (y-axis) over a plurality of unit cells (x-axis) of a transmission line of a JTWPA circuit, according to an exemplary embodiment of the disclosure. FIG. 2A illustrates an exemplary embodiment in which the JTWPA circuit 100 of FIG. 1 comprises 1176 unit cells (e.g., unit cells $\mathbf{110}_1$, $\mathbf{110}_2$, $\mathbf{110}_3$, . . . , $\mathbf{110}_i$, where i=1176), wherein the impedance Z of the transmission line is tapered. In particular, the impedance Z along the transmission line (i) progressively decreases starting from the first unit cell (e.g., $\mathbf{110}_1$) at the input port $P_{IN}$ to a central unit cell (e.g., $\mathbf{110}_{528}$) and (ii) progressively decreases starting from the last unit cell (e.g., $\mathbf{110}_{1176}$) at the output port Pour to the central unit cell (e.g., $\mathbf{110}_{528}$).

The variable impedance Z along the transmission line of the JTWPA circuit 100 is achieved by gradually or incrementally varying the capacitance of the capacitors of the unit cells, either individually or in discrete blocks of unit cells. In particular, FIG. 2A illustrates a first curve 202 which shows that the impedance Z along the transmission line of the JTWPA circuit 100 can be varied by gradually or incrementally changing the capacitance of the capacitor of each successive unit cell. For example, the first curve 202 illustrates an exemplary embodiment where (i) the impedance Z along a first half of the transmission line (e.g., from the first unit cell $\mathbf{110}_1$ to the central unit cell $\mathbf{110}_{528}$) gradually decreases from 50 Ohms down to 30 Ohms by gradually increasing the capacitance of each successive unit cell, and where (ii) the impedance Z along a second half of the transmission line (e.g., from the central unit cell $\mathbf{110}_{528}$ to the last unit cell $\mathbf{110}_{1176}$) gradually increases from 30 Ohms up to 50 Ohms by gradually decreasing the capacitance of each successive unit cell.

Further, FIG. 2A illustrates a second curve 204 which shows that the impedance Z along the transmission line of the JTWPA circuit 100 can be varied by incrementally changing the capacitance of successive blocks of unit cells. For example, the second curve 204 illustrates an exemplary embodiment in which the transmission line of the JTWPA circuit 100 comprises a plurality of blocks of unit cells, $B_1$, $B_2$, $B_2$, . . . , $B_{21}$ (generally, unit cell block B) where each unit cell block $B_1$, $B_2$, $B_2$, . . . , $B_{21}$ comprises 56 successive unit cells. For example, a first unit cell block $B_1$ comprises the unit cells $\mathbf{110}_1$-$\mathbf{110}_{56}$, a second unit cell block $B_2$ comprises the unit cells $\mathbf{110}_{57}$-$\mathbf{110}_{112}$, etc. In this exemplary embodiment, a central unit cell block $B_1$ comprises the unit cells $\mathbf{110}_{561}$-$\mathbf{110}_{616}$, and a last unit cell block $B_{21}$ comprises the unit cells $\mathbf{110}_{1121}$-$\mathbf{110}_{1176}$.

In this exemplary embodiment, the unit cells in each respective unit cell block B comprise a same capacitance such that the impedance Z along a portion of the transmission line for each unit cell block remains relatively constant, but wherein the impedance Z along the transmission line is varied in a stepped manner by changing the impedance from block to block by a fixed amount ΔZ. For example, the second curve 204 in FIG. 2A shows that the impedance Z along the first half of the transmission line (e.g., from the first unit cell block $B_1$ to the central unit cell block $B_{11}$) incrementally decreases from about 50 Ohms down to 30 Ohms by incrementally decreasing the impedance of each unit cell block by ΔZ (which is achieved by incrementally increasing the capacitance of the unit cell capacitors of each successive unit cell block B). In addition, the second curve 204 shows that the impedance Z along the second half of the transmission line (e.g., from the central unit cell block Bu to the last unit cell block $B_{21}$) incrementally increases from 30 Ohms up to about 50 Ohms by incrementally increasing the impedance of each unit cell block by ΔZ (which is achieved by incrementally decreasing the capacitance of the unit cell capacitors of each successive unit cell block B).

It is to be understood that FIG. 2A illustrates a non-limiting exemplary embodiment of the JTWPA circuit 100 having 1176 unit cells in which each unit cell block $B_1$, $B_2$, $B_2$, . . . , $B_{21}$ comprises 56 successive unit cells, and that the 1176 unit cells of the JTWPA circuit 100 can be partitioned into other unit cell block sizes (or bin sizes) with respective ΔZ impedance steps, as needed, depending on the block size. For example, the 1176 unit cells the JTWPA circuit 100 can be partitioned into successive unit cells blocks comprising, e.g., 14 unit cells, or 28 unit cells, etc. It is to be noted that the first curve 202 represents an exemplary embodiment in which the unit cell block size (or bin size) comprises one (1) unit cell.

Figure 2B:
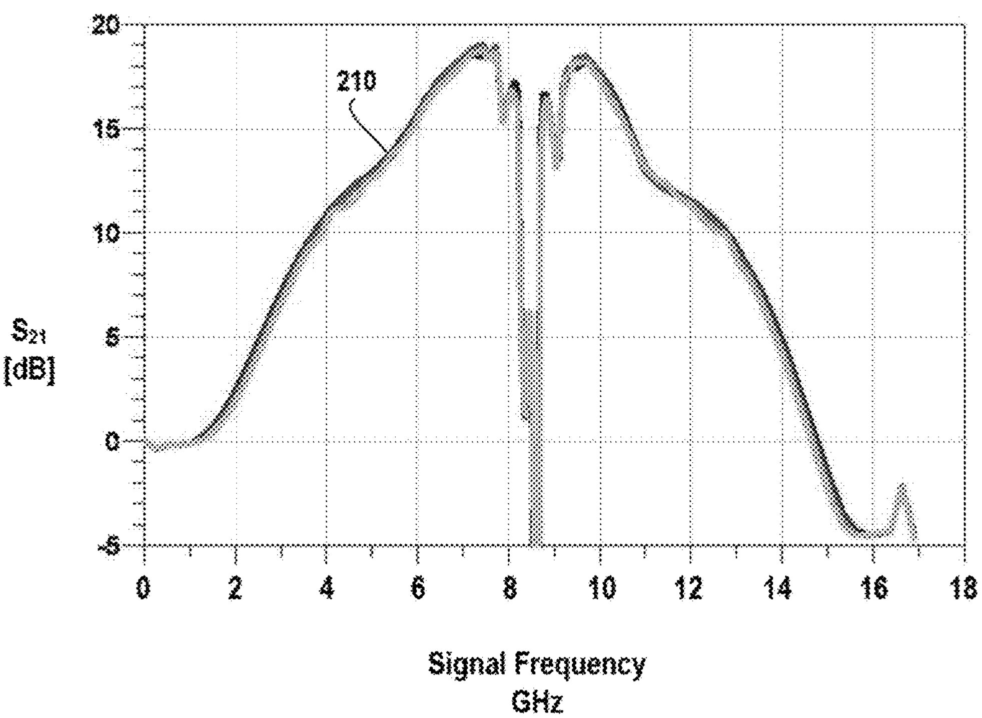
FIG. 2B illustrates simulated scattering parameter waveforms of a Josephson traveling-wave parametric amplifier circuit having variable impedance profiles as shown in FIG. 2A, according to an exemplary embodiment of the disclosure.

FIG. 2B illustrates simulated scattering parameter waveforms of a JTWPA circuit having variable impedance profiles as shown in FIG. 2A, according to an exemplary embodiment of the disclosure. More specifically, FIG. 2B depicts simulated $S_{21}$ waveforms 210 in terms of power in dB (y-axis) as a function of frequency in GHz (x-axis) for respective instances in which the 1176 unit cells the JTWPA circuit 100 are partitioned into unit cell blocks with block sizes (bin sizes) of 1, 14, 28, and 56, with a pump frequency of about 8 GHz. The $S_{21}$ waveform represents a transmission coefficient with regard to the transmission of power from a first port (input port $P_{IN}$) to a second port (output port Pour) of the JTWPA circuit 100. The overlapping simulated $S_{21}$ waveforms 210 as shown in FIG. 2B demonstrate that the gain performance of the JTWPA circuit 100 having the variable impedance profiles as shown in FIG. 2A is essentially consistent for the unit cell block sizes (bin sizes) of 1, 14, 28, and 56.

It is to be noted that the sharp decrease (notch) in the simulated $S_{21}$ waveforms 210 as shown in FIG. 2B (centered around 8.5 GHZ) is due to the dispersion resonators. The transmission line of the JTWPA circuit 100 will amplify signals at the signal frequency, while suppressing signals at or near the resonant frequencies of the dispersion resonators, which results in the notch in the magnitude of the transmission coefficient $S_{21}$ for signals that are at or near the resonant frequencies of the dispersion resonators. It is to be noted that in some embodiments, the capacitance of the coupling capacitors $C_c$ (which couple respective dispersion elements 120 to the transmission line of the JTWPA circuit 100) is incrementally varied (increased or decreased) in steps (e.g., 3 femtofarad (fF) steps) to improve the phase matching. In other words, the capacitance of the coupling capacitors Cc of dispersion elements 120 are varied to adjust the coupling strength of the dispersion elements 120 to the transmission line for purposes of optimizing the phase matching as the impedance of the unit cells is varied over the transmission line of the JTWPA circuit 100.

FIGS. 2A and 2B collectively illustrate an exemplary embodiment in which a JTWPA circuit having 1176 unit cells and a variable impedance architecture as shown in FIG. 2A provides a high gain and large bandwidth, which are similar to the gain and bandwidth achieved with a conventional JTWPA circuit with dispersion engineering and having double the number of unit cells (e.g., 2352 unit cells) with a constant impedance over the transmission line. The exemplary variable impedance architecture as shown in FIG. 2A provides an increase in the effective electrical length of each unit cell as the impedance Z of the unit cell decreases. Therefore, with the tapered impedance profile of a JTWPA circuit as shown in FIG. 2A, the total effective electrical length of all 1176 unit cells of the transmission line of the JTWPA circuit is comparable to the total electrical length of a conventional JTWPA circuit having, e.g., 2352 unit cells, with a constant impedance profile over the transmission line conventional JTWPA circuit. As such, the variable impedance profiles as shown in FIG. 2A allow the JTWPA circuit 100 to be constructed using a significantly smaller number of unit cells and dispersion resonators, which results in a reduced footprint or smaller JTWPA circuit, while having the gain and bandwidth performances of conventional JTWPA circuits having much longer length transmission lines.

In this regard, it is to be noted FIGS. 2A and 2B collectively illustrate an exemplary embodiment of a JTWPA in which the impedance of the unit cells is varied along the transmission line to cause the transmission line to have a "significantly increased effective electrical length" as compared to the electrical length of the transmission line that would be achieved with the same number of unit cells having a constant, unvaried impedance. In particular, the significantly increased effective electrical length obtained by varying the impedance of the unit cells along the transmission line of the JTWPA allows the number of unit cells (with a varying impedance) for implementing JTWPA to be about half or less than half of the number of unit cells (with an unvaried impedance) of a standard JTWPA, while the JTWPA with unit cells of varied impedance provides an amplification (gain) which is comparable to the standard JTWPA with significantly more unit cells of unvaried impedance (e.g., a standard JTWPA having 2352 unit cells with unvaried impedance, as compared to a JTWPA having 1176 unit cells with varying impedance). In this regard, the term "significantly increased effective electrical length" is meant to broadly refer to an amount of increased effective electrical length that is achieved by varying the impedance of unit cells of the transmission line of a JTWPA in a way that allows the JTWPA to be implemented with about half or less than half of the number of units cells (with unvaried impedance) of a standard JTWPA, while achieving comparable amplification (gain).

Figure 3A:
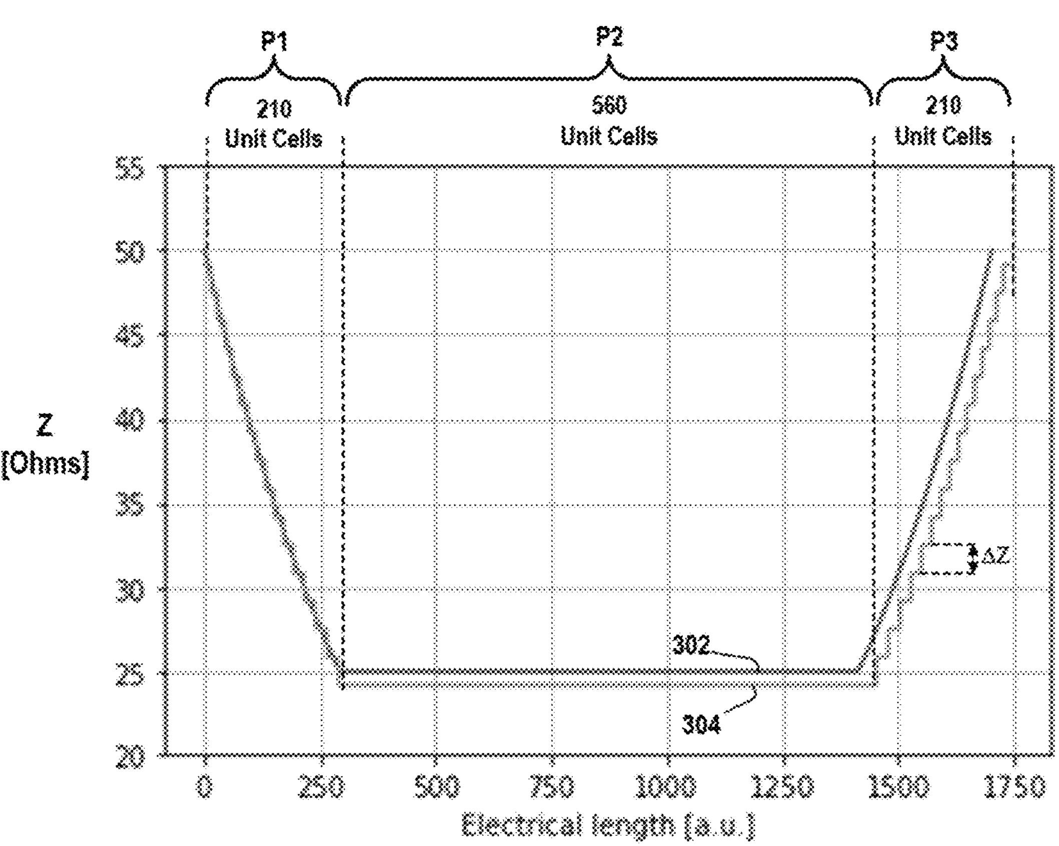
FIG. 3A illustrates techniques for varying an impedance over a plurality of unit cells of a transmission line of a Josephson traveling-wave parametric amplifier circuit, according to another exemplary embodiment of the disclosure.

Next, FIG. 3A illustrates techniques for varying an impedance over a plurality of unit cells of a transmission line of a JTWPA circuit, according to another exemplary embodiment of the disclosure. In particular, FIG. 3A illustrates variable impedance profiles 300 for varying the capacitance of unit cells a transmission line of a JTWPA circuit having 980 unit cells (e.g., unit cells $\mathbf{110}_1$, $\mathbf{110}_2$, $\mathbf{110}_3$, . . . , $\mathbf{110}_{980}$). FIG. 3A illustrates an exemplary embodiment in which the capacitance of the unit cells is varied differently in different portions P1, P2, and P3 of the transmission line of the JTWPA circuit 100. For example, FIG. 3A illustrates an exemplary embodiment in which the transmission line of the JTWPA circuit 100 comprises (i) a beginning portion P1 which comprises 210 unit cells (e.g., unit cells $\mathbf{110}_1$-$\mathbf{110}_{210}$) having a decreasing impedance, (ii) a middle portion P2 which comprises 560 unit cells (e.g., unit cells $\mathbf{110}_{211}$-$\mathbf{110}_{770}$) having a constant impedance, and (iii) an end portion P3 which comprises 210 unit cells (e.g., unit cells $\mathbf{110}_{771}$-$\mathbf{110}_{980}$) having an increasing impedance.

More specifically, FIG. 3A illustrates a first curve 302 which shows an exemplary embodiment where (i) the impedance Z in the beginning portion P1 of the transmission line (e.g., from the first unit cell $\mathbf{110}_1$ to the unit cell $\mathbf{110}_{210}$) gradually decreases from 50 Ohms down to 25 Ohms by gradually increasing the capacitance of each successive unit cell in the beginning portion P1, (ii) the impedance Z in the middle portion P2 of the transmission line (e.g., from the unit cell $\mathbf{110}_{211}$ to the unit cell $\mathbf{110}_{770}$) remains constant at 25 Ohms with the capacitance of each successive unit cell remaining constant in the middle portion P2, and where (iii) the impedance Z in the end portion P3 of the transmission line (e.g., from the unit cell $\mathbf{110}_{771}$ to the last unit cell $\mathbf{110}_{980}$) gradually increases from 25 Ohms up to 50 Ohms by gradually decreasing the capacitance of each successive unit cell in the end portion P3.

Further, FIG. 3A illustrates a second curve 304 which shows that the impedance Z along the beginning and end portions P1 and P3 of the transmission line of the JTWPA circuit 100 can be varied by incrementally changing the capacitance of successive blocks of unit cells, wherein each unit cell block B comprises 14 successive unit cells. For example, in the beginning portion P1, the initial 210 unit cells comprise 15 unit cell blocks, where each unit cell block comprises 14 unit cells. Similarly, in the end portion P3, the final 210 unit cells comprise 15 unit cells blocks, where each unit cell block comprises 14 unit cells. Moreover, the 560 unit cells in the middle portion P2 can be considered as a single unit cell block having 560 unit cells, each having the same capacitance to provide a constant impedance over the entire middle portion P2.

The second curve 304 in FIG. 3A shows that the impedance Z along the beginning portion P1 of the transmission line incrementally decreases from about 50 Ohms down to about 25 Ohms by incrementally decreasing the impedance of each successive unit cell block by $\Delta Z$ (of the 15 unit cell blocks in the beginning portion P1), which is achieved by incrementally increasing the capacitance of the unit cell capacitors of each successive unit cell block in the beginning portion P1. In addition, the second curve 304 shows that the impedance Z along the end portion P3 of the transmission line incrementally increases from about 25 Ohms up to 50 Ohms by incrementally increasing the impedance of each unit cell block by $\Delta Z$ (of the 15 unit cell blocks in the end portion P3) which is achieved by incrementally decreasing the capacitance of the unit cell capacitors of each successive unit cell block in the end portion P3. Further, as noted above, the impedance in the middle portion P2 of the transmission line remains constant at about 25 Ohms by maintaining a constant capacitance for each of the capacitors in the 560 unit cells in the middle portion P2.

Figure 3B:
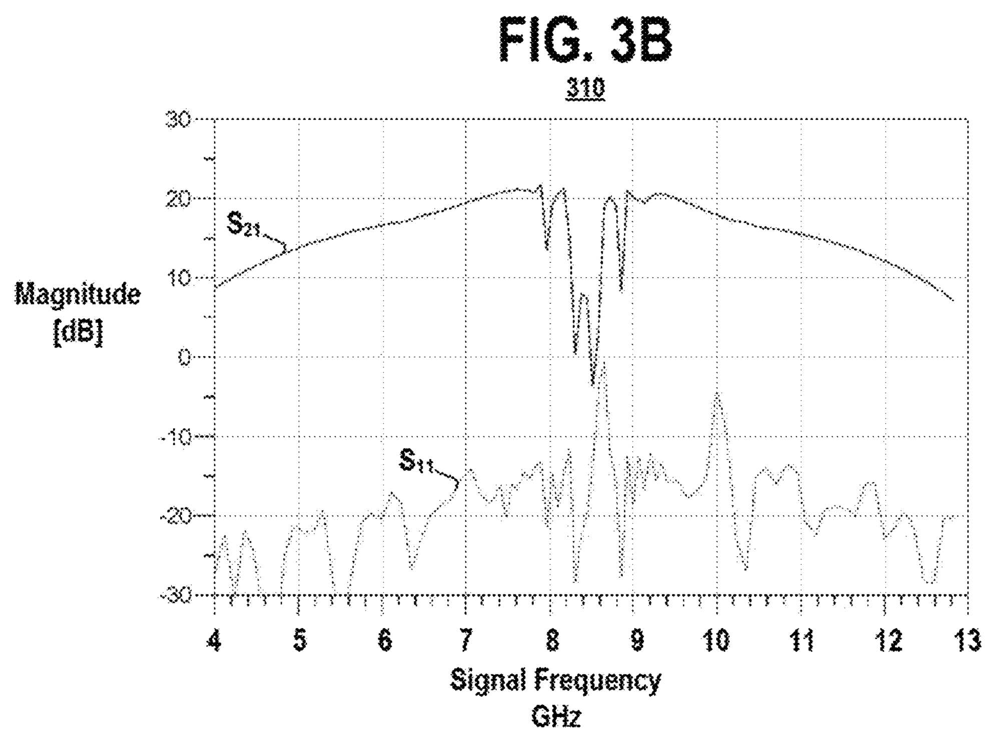
FIG. 3B illustrates simulated scattering parameter waveforms of a Josephson traveling-wave parametric amplifier circuit having variable impedance profiles as shown in FIG. 3A, according to an exemplary embodiment of the disclosure.

FIG. 3B illustrates simulated scattering parameter waveforms 310 of a JTWPA circuit having variable impedance profiles as shown in FIG. 3A, according to an exemplary embodiment of the disclosure. More specifically, FIG. 3B depicts a simulated $S_{21}$ waveform and a simulated $S_{11}$ waveform in terms of power in dB (y-axis) as a function of frequency in GHz (x-axis) for a JTWPA circuit having 980 unit cells with an impedance profile as shown in FIG. 3A. The $S_{21}$ waveform represents a transmission coefficient with regard to the transmission of power from a first port (input port $P_{IN}$) to a second port (output port $P_{OUT}$) of the JTWPA circuit. The $S_{11}$ waveform represents a reflection coefficient with respect to power applied to the first port (input port $P_{IN}$) of the JTWPA circuit.

FIGS. 3A and 3B collectively illustrate an exemplary embodiment in which a JTWPA circuit having 980 unit cells and a variable impedance architecture as shown in FIG. 3A provides a high gain and large bandwidth, which are similar to the gain and bandwidth achieved with a conventional JTWPA circuit with dispersion engineering and having a relatively large number of unit cells (e.g., 2352 unit cells) with a constant impedance over the transmission line.

As compared to the linear variable impedance profiles shown in FIG. 2A which implement a symmetric V-shaped variable impedance profile, the variable impedance profiles shown in FIG. 3A which utilize short sections (e.g., portions P1 and P3) at the beginning and end of the transmission line to impedance match from 50 Ohms to 25 Ohms, allow for the construction of a JTWPA circuit with an even smaller number of unit cells (e.g., 980 unit cells) as compared to a JTWPA circuit having 1176 unit cells (FIG. 2A), while achieving a similar performance in terms of gain and bandwidth, as illustrated by the simulated scattering parameter waveforms of FIGS. 2B and 3B.

It is to be noted that FIGS. 2A and 3A illustrate exemplary variable impedance profiles for JTWPA circuits having input and output impedances that are designed to have a characteristic impedance of 50 Ohms (or near 50 Ohms) to enable impedance matching in 50 Ohm environments. However, there can be instances where the input impedance and/or output impedance of the JTWPA circuit must be matched to impedances that are not the standard 50 Ohm. In this regard, the variable impedance profile of a JTWPA circuit can be designed to provide the desired amplification for a smaller number of unit cells, as well as perform impedance matching when the input and output impedances are not matched, thus eliminating the need for a separate impedance matching element.

Figure 4A:
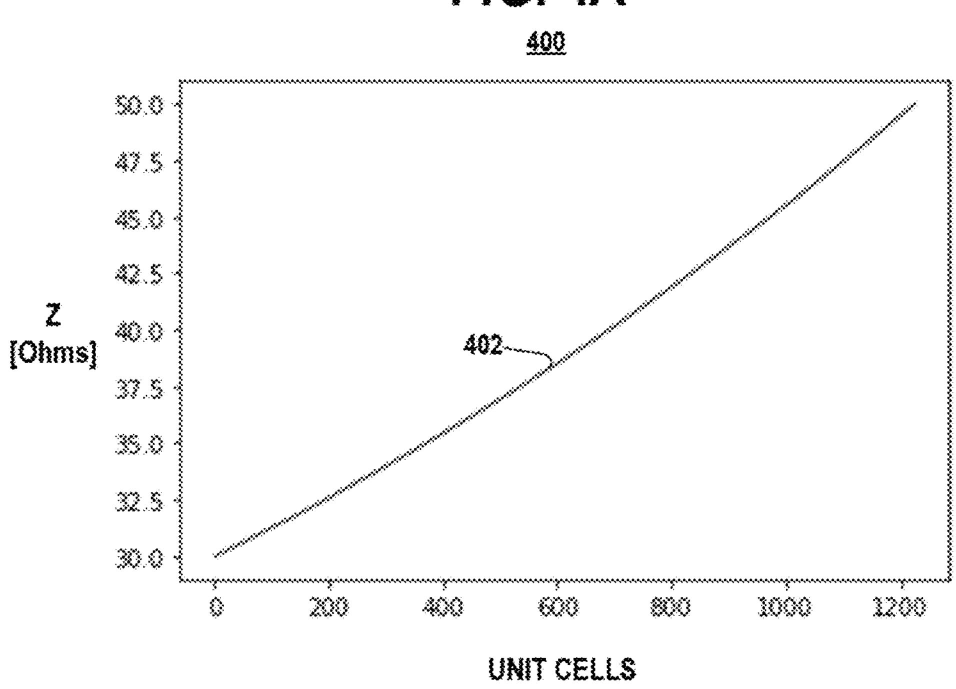
FIG. 4A illustrates a technique for varying an impedance over a plurality of unit cells of a transmission line of a Josephson traveling-wave parametric amplifier circuit, according to another exemplary embodiment of the disclosure.

FIG. 4A illustrates a technique for varying an impedance over a plurality of unit cells of a transmission line of a JTWPA circuit, according to another exemplary embodiment of the disclosure. In particular, FIG. 4A illustrates a variable impedance profile 400 for varying the capacitance unit cells to vary the impedance Z (y-axis) over a plurality of unit cells (x-axis) of a transmission line of a JTWPA circuit. Similar to FIG. 2A, the exemplary embodiment of FIG. 4A illustrates a variable impedance profile in which the JTWPA circuit 100 of FIG. 1 comprises 1176 unit cells (e.g., unit cells $\mathbf{110}_1$, $\mathbf{110}_2$, $\mathbf{110}_3$, . . . , $\mathbf{110}_{1176}$), but wherein FIG. 4A shows a curve 402 of a variable impedance profile where the impedance Z along the transmission line progressively increases from 30 Ohms to about 50 Ohms starting at first unit cell (e.g. $\mathbf{110}_1$) at the input port $P_{IN}$ to the last unit cell (e.g. $\mathbf{110}_{1176}$) at the output port Pour. In this regard, in FIG. 4A, the curve 402 illustrates a variable impedance profile that is designed to match a 30 Ohm input impedance to a 50 Ohm output impedance, wherein the capacitance of the capacitors of the unit cells $\mathbf{110}_1$, $\mathbf{110}_2$, $\mathbf{110}_3$, . . . , $\mathbf{110}_{1176}$ gradually decreases to gradually increase the impedance Z along the transmission line (while maintaining a constant critical current of the Josephson junctions of the unit cells). It is to be noted that the increasing impedance profile is exponential in electrical length which works out to be roughly linear as a function of physical length (e.g., per unit cell) such as shown in FIG. 4A. In other words, in some embodiments, the impedance of successive unit cells along at least a portion of the transmission line is varied exponentially with respect to electrical length.

Figure 4B:
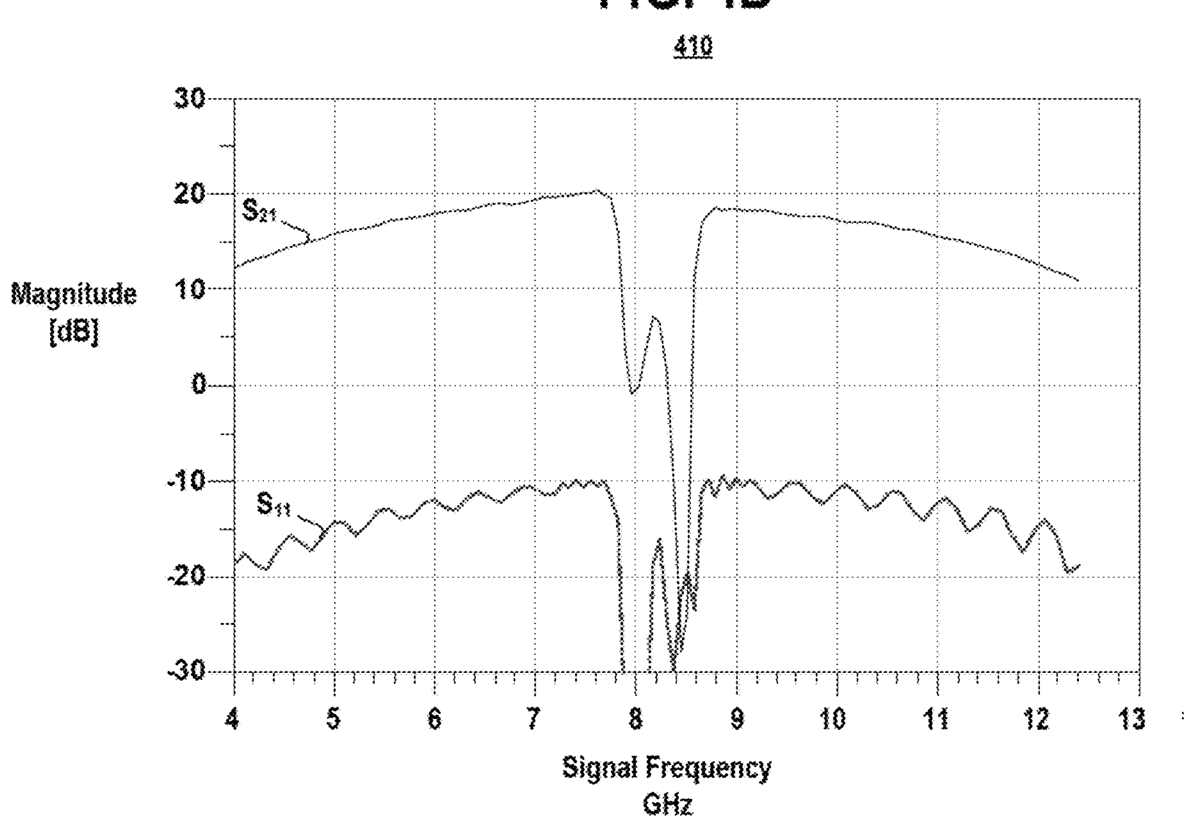
FIG. 4B illustrates simulated scattering parameter waveforms of a Josephson traveling-wave parametric amplifier circuit having a variable impedance profile as shown in FIG. 4A, according to an exemplary embodiment of the disclosure.

FIG. 4B illustrates simulated scattering parameter waveforms 410 of a JTWPA circuit having a variable impedance profile as shown in FIG. 4A, according to an exemplary embodiment of the disclosure. More specifically, FIG. 4B depicts a simulated $S_{21}$ waveform and a simulated Su waveform in terms of power in dB (y-axis) as a function of frequency in GHz (x-axis) for a JTWPA circuit having 1176 unit cells with an impedance profile as shown in FIG. 4A. FIGS. 4A and 4B collectively illustrate an exemplary embodiment in which a JTWPA circuit having 1176 unit cells and a variable impedance architecture as shown in FIG. 4A can simultaneously provide embedded impedance matching capabilities to match input and output impedances, while providing a high gain and large bandwidth, which are similar to the gain and bandwidth achieved with a conventional JTWPA circuit with dispersion engineering and having a relatively large number of unit cells (e.g., 2352 unit cells) with a constant impedance over the transmission line.

While FIGS. 2A, 3A, and 4A illustrate exemplary embodiments for varying the capacitance of the unit cells along the transmission line of the JTWPA circuit 100 to achieve target variable impedance profiles, in other embodiments as noted above, the impedance can be varied along the non-linear transmission line of the JTWPA circuit 100 by varying the critical current $I_c$ of the Josephson junction devices of the unit cells. Recall that a Josephson junction comprises an inductance $L_J$ which is determined as $$L_J = \frac{\Phi_0}{2\pi I_C \cos\varphi},$$

and that the impedance of the non-linear transmission line is approximated as:

$$Z = \sqrt{\frac{L_{J0}}{C}}.$$

In this regard, the impedance of a given unit cell can be (i) increased by decreasing the critical current $I_C$ of the Josephson junction device of the given unit cell, or (ii) decreased by increasing critical current $I_C$ of the Josephson junction device of the given unit cell. In other words, decreasing $I_C$ increases $L_{J0}$, resulting in an increase in Z. On the other hand, increasing $I_C$ decreases $L_{J0}$, resulting in a decrease in Z.

The variable impedance profile 400 as shown in FIG. 4A for a JTWPA circuit 100 having a transmission line which comprises 1176 unit cells (e.g., unit cells $\mathbf{110}_1$, $\mathbf{110}_2$, $\mathbf{110}_3$, . . . , $\mathbf{110}_{1176}$), where the impedance Z along the transmission line progressively increases from about 30 Ohms to about 50 Ohms from the input port $P_{IN}$ to the output port $P_{OUT}$, can be obtained by gradually decreasing the critical current $I_C$ of the Josephson junctions of the unit cells along the length of the JTWPA circuit 100 from the first unit cell to the last unit cell to match a low impedance (e.g., 30 Ohms) to a higher impedance (e.g., 50 Ohms). An advantage to such a design is that because of a typical insertion loss in a JTWPA circuit, the pump tone decreases in amplitude along the length of the device and, therefore, the critical current $I_C$ can gradually decrease with less risk of the pump signal overdriving the Josephson junctions (i.e., without driving the Josephson junctions with currents that exceed the critical currents).

Figure 5:
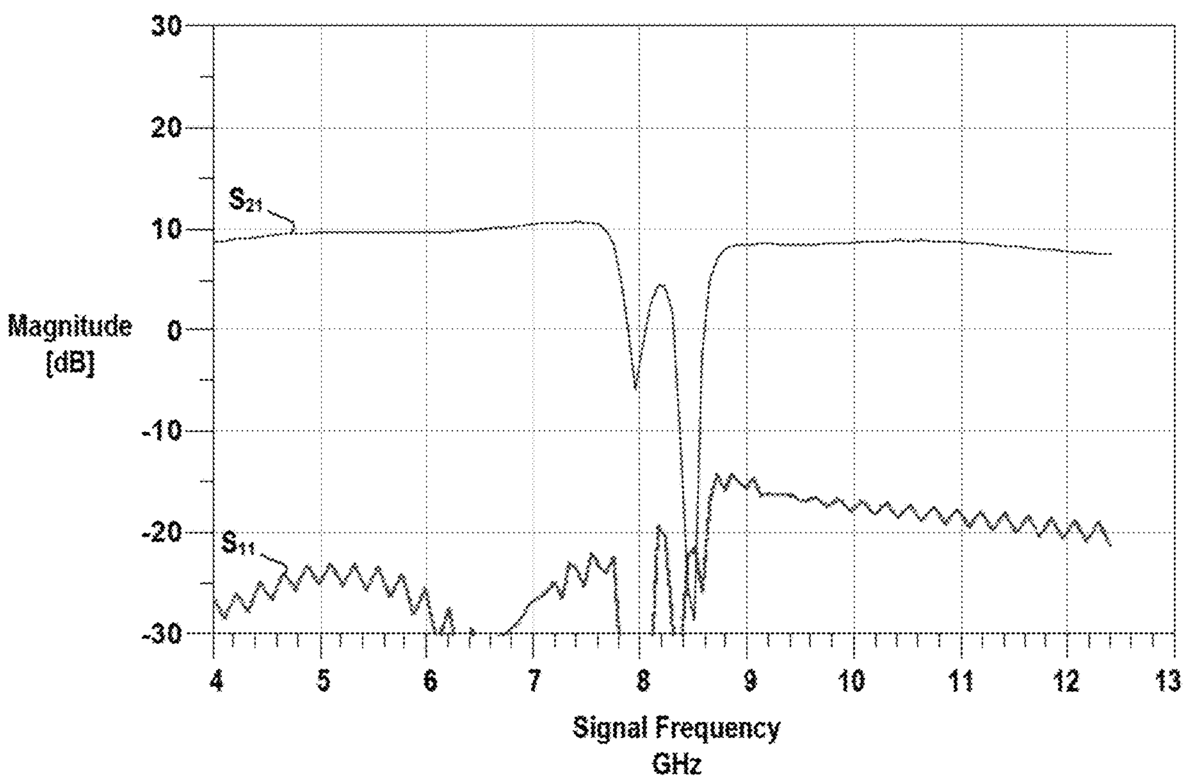
FIG. 5 illustrates simulated scattering parameter waveforms of a Josephson traveling-wave parametric amplifier circuit having a variable impedance that is achieved by varying a critical current of Josephson junctions of unit cells of the Josephson traveling-wave parametric amplifier circuit, according to another exemplary embodiment of the disclosure.

FIG. 5 illustrates simulated scattering parameter waveforms 500 of a JTWPA circuit having a variable impedance profile which is achieved by varying a critical current of Josephson junctions along a transmission line of the JTWPA circuit, according to an exemplary embodiment of the disclosure. More specifically, FIG. 5 depicts a simulated $S_{21}$ waveform and a simulated Su waveform in terms of power in dB (y-axis) as a function of frequency in GHz (x-axis) for a JTWPA circuit having 1176 unit cells with an impedance profile similar to that shown in FIG. 4A wherein the critical current $I_C$ of the Josephson junctions gradually decreases along the transmission line to gradually increase the impedance Z along the transmission line from about 30 Ohms to about 50 Ohms from the input port $P_{IN}$ to the output port Pour. In this regard, FIG. 5 illustrate an exemplary embodiment in which a JTWPA circuit having 1176 unit cells and a variable impedance profile (similar to that shown in FIG. 4A) obtained by varying the critical current of the Josephson junctions along the transmission line can simultaneously provide embedded impedance matching capabilities to match input and output impedances, while providing a desired gain and bandwidth performance with a smaller number of unit cells as compared to a conventional JTWPA circuit with a larger number of unit cells and a constant impedance over the transmission line.

In other embodiments, the critical current and capacitance of unit cells can be varied in the same JTWPA circuit. For example, consider a JTWPA circuit with a variable impedance profile similar to that as shown in FIG. 2A, wherein the impedance Z along the first half of the transmission line (e.g., from the first unit cell $\mathbf{110}_1$ to the central unit cell $\mathbf{110}_{528}$) gradually decreases from 50 Ohms down to 30 Ohms, and wherein the impedance Z along the second half of the transmission line (e.g., from the central unit cell $\mathbf{110}_{528}$ to the last unit cell $\mathbf{110}_{1176}$) gradually increases from 30 Ohms up to 50 Ohms. The decreasing impedance Z profile along the first half of the transmission line can be achieved by varying the capacitance (increasing the capacitance) in the successive unit cells or the successive unit cell blocks in the first half of the transmission line. On the other hand, the increasing impedance Z profile along the second half of the transmission line can be achieved by varying the critical current (decreasing the critical current) of the Josephson junctions in each successive unit cell or successive unit cell block in the second half of the transmission line.

Figure 6:
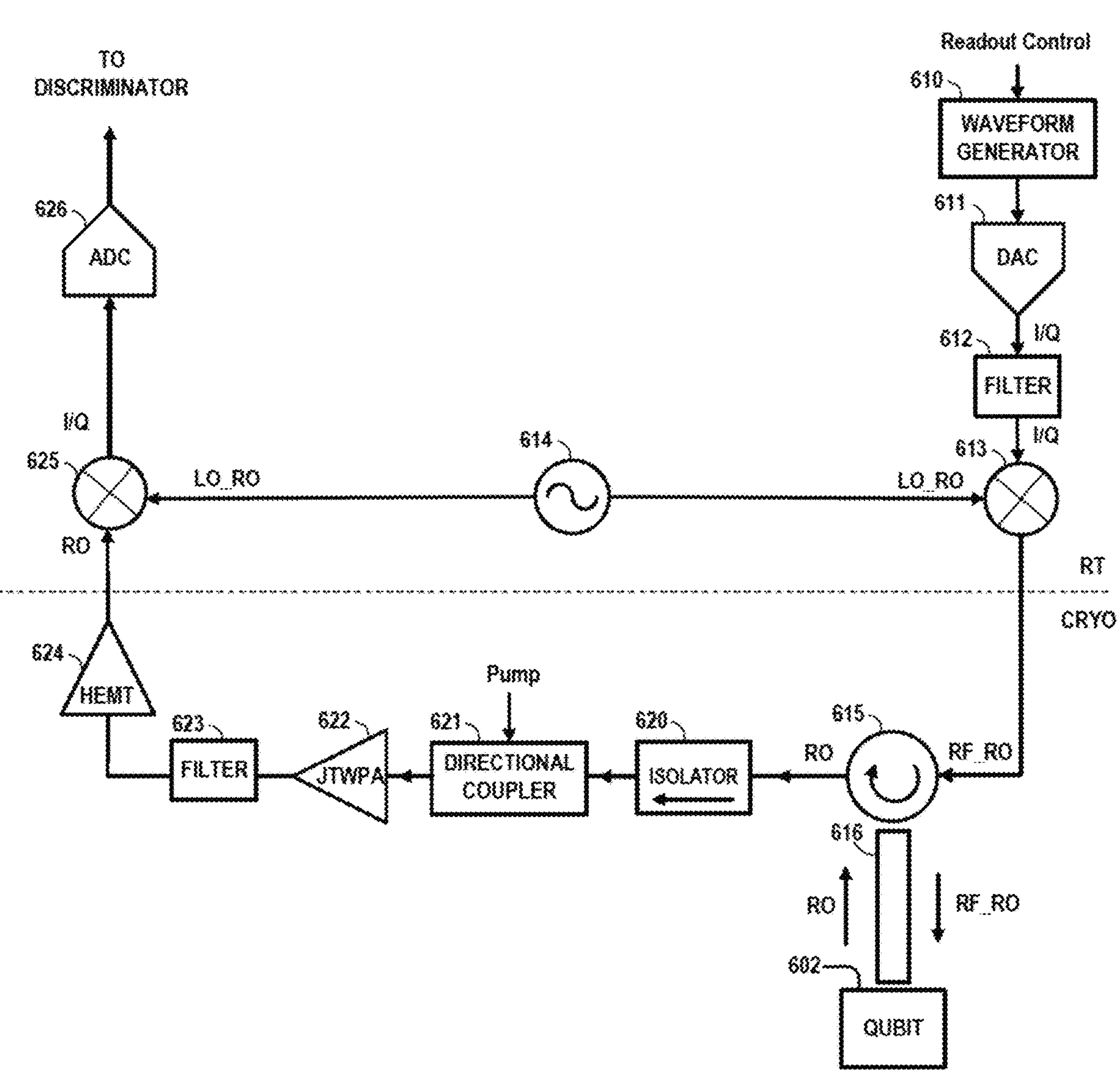
FIG. 6 schematically illustrates readout circuitry of a quantum processing system in which Josephson traveling-wave parametric amplifier circuits are implemented in qubit readout signal paths to amplify qubit readout signals, according to an exemplary embodiment of the disclosure.

FIG. 6 schematically illustrates readout circuitry of a quantum processing system, which can implement JTWPA circuits in qubit readout signal paths for amplifying qubit readout signals, according to an exemplary embodiment of the disclosure. More specifically, FIG. 6 schematically illustrates qubit readout control circuitry 600 of a quantum computing system which is configured to readout a quantum state of at least one superconducting qubit 602. The qubit readout control circuitry 600 is configured to generate an RF readout control signal (RF_RO) to readout the state of the superconducting qubit 602 using a dispersive readout scheme which enables a quantum non-demolition measurement of the state of the superconducting qubit 602 to preserve the state of the superconducting qubit 602. In an exemplary embodiment, the qubit readout control circuitry 600 receives and processes readout control signals from a control process.

The qubit readout control circuitry 600 comprises a waveform generator 610 (or pulse envelope generator), digital-to-analog (DAC) circuitry 611, low-pass filter circuitry 612, a first I/Q mixer 613 (upconverter mixer), a local oscillator (LO) signal generator 614, a circulator 615, a readout resonator 616, and a readout signal chain which comprises an isolator circuit 620, a directional coupler 621, a JTWPA circuit 622, a filter 623, a high-electron-mobility-transistor (HEMT) amplifier 624, a second I/Q mixer 625, and analog-to-digital converter (ADC) circuitry 626, which outputs digital readout signals to a hardware or software based discriminator to determine a readout state of the superconducting qubit 602.

The waveform generator 610 is configured to generate digital I and Q signals with a given type of pulse envelope (e.g., Gaussian square pulse envelope) for qubit state readout, in response to a readout control signal. The DAC circuitry 611 is configured to convert the digital I and Q pulses into analog I and Q control pulses which are filtered by the low-pass filter circuitry 612. The filtered analog control I and Q control pulses are applied to the first I/Q mixer 613, along with an LO signal (LO_RO) that is generated by the LO signal generator 614, to generate an RF readout control pulse RF_RO. In particular, the I/Q mixer 613 is configured mix the analog I and Q control pulses with the LO_Q signals of a given LO frequency (e.g., 7 GHZ) to perform I/Q modulation and upconversion and/or downconversion using known techniques (e.g., single sideband modulation) to generate the RF readout control pulse RF_RO.

The RF readout control signal RF_RO is applied to an input port of the circulator 615, and then coupled to the readout resonator 616. The readout resonator 616 is capacitively coupled to the superconducting qubit 602, thereby providing a qubit/resonator system. In some embodiments, the readout resonator 616 comprises, e.g., a half-wavelength coplanar waveguide resonator, having a resonant frequency that is the same or similar to a center frequency of the RF readout control signal RF_RO. The resonant frequency of the readout resonator 616 is detuned from the transition frequency of the superconducting qubit 602. In the dispersive regime of qubit-resonator coupling, the RF readout control signal RF_RO (with the requisite frequency tone, pulse envelope shape, and pulse duration) interacts with the given qubit/resonator system in a manner which results in the generation of a resulting readout signal RO that is reflected out from the readout resonator 616, wherein the readout signal RO comprises information (e.g., phase and/or amplitude) that is qubit-state dependent. In other words, the dispersive readout process yields an RF readout signal RO having a state-dependent phasor response, which is analyzed to discriminate the quantum state of the superconducting qubit 602.

In another exemplary configuration, the RF readout control signal RF_RO is applied to an input port of a readout resonator 616 that is coupled to the superconducting qubit 602. The readout signal RO is output from the readout resonator 616 via an output port. The input port of the readout resonator 616 is much more weakly coupled to the readout resonator 616 than the output port so the readout signal RO exits via the output port. Optionally, the output port of the readout resonator 616 can be coupled to a Purcell filter, which is designed to pass at the frequency of the readout signal RO while blocking at the qubit frequency, to enhance the qubit lifetime.

The readout signal RO that is returned from the readout resonator 616 is input to the circulator 615, and then coupled out to the readout signal chain where the readout signal RO flows through the isolator circuit 620 and directional coupler 621 and applied to an input port of the JTWPA circuit 622. In addition, the directional coupler 621 receives a pump signal and couples the pump signal to the input port of the JTWPA circuit 622. The JTWPA circuit 622 amplifies the readout signal RO by, e.g., performing a 4-wave mixing process using the pump signal, as discussed above. The JTWPA circuit 622 can be implemented using any of the exemplary JTWPA circuits with variable impedance transmission lines, as discussed herein.

The amplified readout signal RO, which is output from the JTWPA circuit 622, is transmitted along a signal chain comprising the filter 623 and another optional isolator circuit, amplified by the HEMT amplifier 624, and applied to an input of the second I/Q mixer 625. The second I/Q mixer 625 mixes the RF readout signal RO with the LO_RO signal to perform a down conversion operation where the RF readout signal RO is down converted and split into analog I and Q signals. The analog I and Q signals are input to the ADC circuitry 626 and sampled by the ADC circuitry 626 to generate respective digital I and Q signals that are indicative of the amplitude and phase of the readout signal RO. A discriminator analyzes the digital I and Q signals to discriminate the measured quantum state of the superconducting qubit 602 based on the amplitude and phase components of the readout signal RO.

It is to be understood that FIG. 6 is an exemplary non-limiting embodiment which schematically illustrates a high-level schematic illustration of readout control circuitry. The qubit readout control circuitry 600 and readout signal chain can be implemented using other components and configurations. For example, a frequency-multiplexed readout system (which implements frequency domain multiplexing) can be utilized to scale-up a readout chain in a quantum computing system for reading the quantum states of superconducting qubits in relatively large superconducting quantum computers. In a frequency-multiplexed readout system, multiple readout resonators (with different resonance frequencies) are coupled to separate qubits and commonly coupled to a communication bus. The communication bus is configured to allow the transmission of multiple readout signals with readout frequencies which match the resonance frequencies of the readout resonators, and, thus simultaneously read out the quantum states of multiple qubits using one input and one output line.

It is to be noted that high-fidelity dispersive readout of a superconducting qubit requires a properly engineered amplifier (e.g., JTWPA circuit 622) and sufficient microwave circuit impedance matching. Traditionally, it is assumed that the amplifier is embedded in a 50 Ohm environment, such that the input and output impedances of the amplifier are matched to 50 Ohms. However, there are various instances where the impedances of upstream and/or downstream microwave components coupled the input and outport ports of the amplifier are different from 50 Ohms. For example, superconducting ADCs can have an intrinsically low input impedance. Moreover, increasing the density or reducing the loss in either flex-cables or multilevel wiring structures may require impedances other than 50 Ohms. As another example, impedance engineering can be a part of the Purcell protection of qubits, wherein Purcell filters are used to enable strong qubit-resonator coupling for dispersive readout while increasing the qubit lifetime, which can require matching to impedances other than 50 Ohms. Advantageously, with the JTWPA circuit 622 in the readout chain shown in FIG. 6 the characteristic impedance can be varied along the non-linear transmission line of the JTWPA circuit 622 to provide an impedance transformation between dissimilar input and output impedances at the input and output ports of the JTWPA circuit 622 to essentially provide embedded impedance matching circuitry within the JTWPA circuit 622, which thereby eliminates the need to implement separate impedance matching element(s) in the readout chain upstream or downstream of the JTWPA circuit 622.

Figure 7:
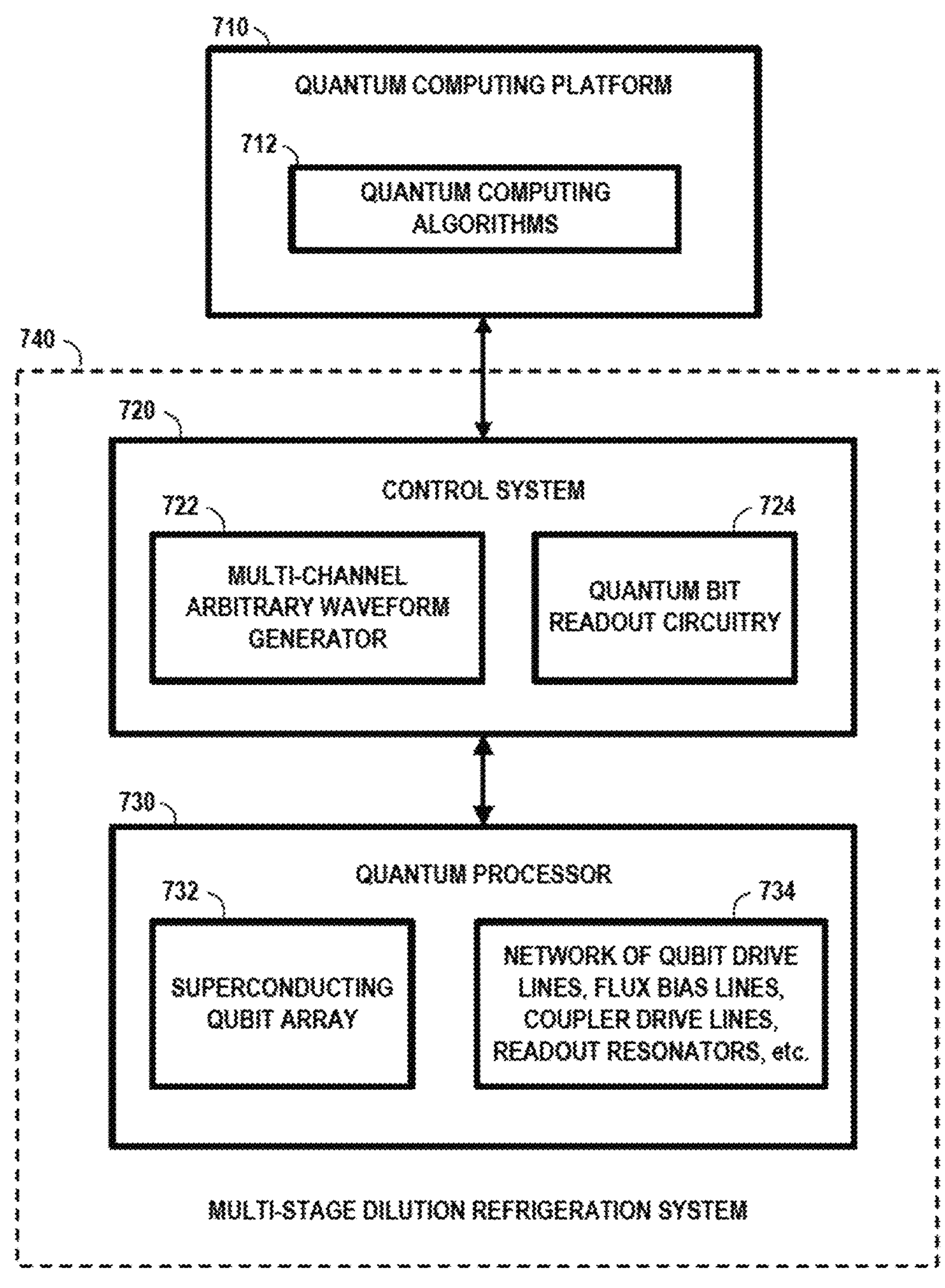
FIG. 7 schematically illustrates a quantum computing system, according to an exemplary embodiment of the disclosure.

FIG. 7 schematically illustrates a quantum computing system 700 which comprises a quantum computing platform 710, a control system 720, and a quantum processor 730. In some embodiments, the quantum computing platform 710 implements a software platform that is configured to program a quantum computer to execute quantum computing algorithms 712 which are implemented using, e.g., quantum circuits which define computational routings consisting of coherent quantum operations on quantum data, such as qubits. In addition, in some embodiments, the control system 720 comprises a multi-channel arbitrary waveform generator 722, and a quantum bit readout control system 724. The quantum processor 730 comprises one or more solid-state quantum chips which comprise, e.g., a superconducting qubit array 732, and a network 734 of qubit drive lines, flux-bias control lines, qubit coupler drive lines, qubit state readout resonators, and other circuit QED components that may be needed for a given application or quantum system configuration.

In some embodiments, the control system 720 and the quantum processor 730 are disposed in a dilution refrigeration system 740 which can generate cryogenic temperatures that are sufficient to operate components of the control system 720 for quantum computing applications. For example, the quantum processor 730 may need to be cooled down to near-absolute zero, e.g., 10-15 millikelvin (mK), to allow the superconducting qubits to exhibit quantum behaviors. In some embodiments, the dilution refrigeration system 740 comprises a multi-stage dilution refrigerator where the components of the control system 720 can be maintained at different cryogenic temperatures, as needed. For example, while the quantum processor 730 may need to be cooled down to, e.g., 10-15 mK, the circuit components of the control system 720 may be operated at cryogenic temperatures greater than 10-15 mK (e.g., cryogenic temperatures in a range of 3K-4K), depending on the configuration of the quantum computing system. In some embodiments, the entirety of the control system 720, or some components thereof, are disposed in a room temperature environment.

In some embodiments, the superconducting qubit array 732 comprises a quantum system of superconducting qubits, superconducting qubit couplers, and other components commonly utilized to support quantum processing using qubits. The number of superconducting qubits of the superconducting qubit array 732 can be on the order of tens, hundreds, thousands, or more, etc. The network 734 of qubit drive lines, flux bias control lines, coupler drive lines, and qubit state readout resonators, etc., is configured to apply microwave control signals to superconducting qubits and coupler circuitry in the superconducting qubit array 732 to perform various types of gate operations, e.g., single-gate operations, entanglement gate operations, perform error correction operations, etc., as well as read the quantum states of the superconducting qubits. For example, microwave control pulses are applied to the qubit drive lines of respective superconducting qubits to change the quantum state of the superconducting qubits (e.g., change the quantum state of a given qubit between the ground state and excited state, or to a superposition state) when executing quantum information processing algorithms.

Furthermore, as noted above, the state readout lines comprise readout resonators that are coupled to respective superconducting qubits. The state of a given superconducting qubit can be determined through microwave transmission or reflection measurements using the readout ports of the readout resonator. The states of the superconducting qubits are read out after executing a quantum algorithm. In some embodiments, as noted above, a dispersive readout operation is performed in which a change in the resonant frequency of a given readout resonator, which is coupled to a given superconducting qubit, is utilized to readout the state (e.g., ground or excited state) of the given superconducting qubit.

The network 734 of qubit drive lines, flux bias lines, qubit coupler drive lines, qubit state readout resonators, etc., is coupled to the control system 720 through a suitable hardware input/output (I/O) interface, which couples I/O signals between the control system 720 and the quantum processor 730. For example, the hardware I/O interface may comprise various types of hardware and components, such as RF cables, wiring, RF elements, optical fibers, heat exchanges, filters, amplifiers, isolators, etc.

In some embodiments, the multi-channel arbitrary waveform generator (AWG) 722 and other suitable microwave pulse signal generators are configured to generate the microwave control pulses that are applied to the qubit drive lines, and the coupler drive lines to control the operation of the superconducting qubits and associated qubit coupler circuitry, when performing various gate operations to execute a given certain quantum information processing algorithm. In some embodiments, the multi-channel AWG 722 comprises a plurality of AWG channels, which control respective superconducting qubits within the superconducting qubit array 732 of the quantum processor 730. In some embodiments, each AWG channel comprises a baseband signal generator, a digital-to-analog converter (DAC) stage, a filter stage, a modulation stage, an impedance matching network, and a phase-locked loop system to generate LO signals (e.g., quadrature LO signals LO_I and LO_Q) for the respective modulation stages of the respective AWG channels.

In some embodiments, the multi-channel AWG 722 comprises a quadrature AWG system which is configured to process quadrature signals, wherein a quadrature signal comprises an in-phase (I) signal component, and a quadrature-phase (Q) signal component. In each AWG channel the baseband signal generator is configured to receive baseband data as input (e.g., from the quantum computing platform), and generate digital quadrature signals I and Q which represent the input baseband data. In this process, the baseband data that is input to the baseband signal generator for a given AWG channel is separated into two orthogonal digital components including an in-phase (I) baseband component and a quadrature-phase (Q) baseband component. The baseband signal generator for the given AWG channel will generate the requisite digital quadrature baseband IQ signals which are needed to generate an analog waveform (e.g., sinusoidal voltage waveform) with a target center frequency that is configured to operate or otherwise control a given quantum bit that is coupled to the output of the given AWG channel.

The DAC stage for the given AWG channel is configured to convert a digital baseband signal (e.g., a digital IQ signal output from the baseband signal generator) to an analog baseband signal (e.g., analog baseband signals I (t) and Q (t)) having a baseband frequency. The filter stage for the given AWG channel is configured to filter the IQ analog signal components output from the DAC stage to thereby generate filtered analog IQ signals. The modulation stage for the given AWG channel is configured to perform analog IQ signal modulation (e.g., single-sideband (SSB) modulation) by mixing the filtered analog signals I (t) and Q (t), which are output from the filter stage, with quadrature LO signals (e.g., an in-phase LO signal (LO_I) and a quadrature-phase LO signal (LO_Q)) to generate and output an analog RF signal (e.g., a single-sideband modulated RF output signal). In some embodiments, the quantum bit readout control system 724 is implemented based on the readout circuit architecture as schematically shown in FIG. 6.

The quantum computing platform 710 comprises a software and hardware platform which comprises various software layers that are configured to perform various functions, including, but not limited to, generating and implementing various quantum applications using suitable quantum programming languages, configuring and implementing various quantum gate operations, compiling quantum programs into a quantum assembly language, implementing and utilizing a suitable quantum instruction set architecture (ISA), performing calibration operations to calibrate the quantum circuit elements and gate operations, etc. In addition, the quantum computing platform 710 comprises a hardware architecture of processors, memory, etc., which is configured to control the execution of quantum applications, and interface with the control system 720 to (i) generate digital control signals that are converted to analog microwave control signals by the control system 720, to control operations of the quantum processor 730 when executing a given quantum application, and (ii) to obtain and process digital signals received from the control system 720, which represent the processing results generated by the quantum processor 730 when executing various gate operations for a given quantum application.

Figure 8:
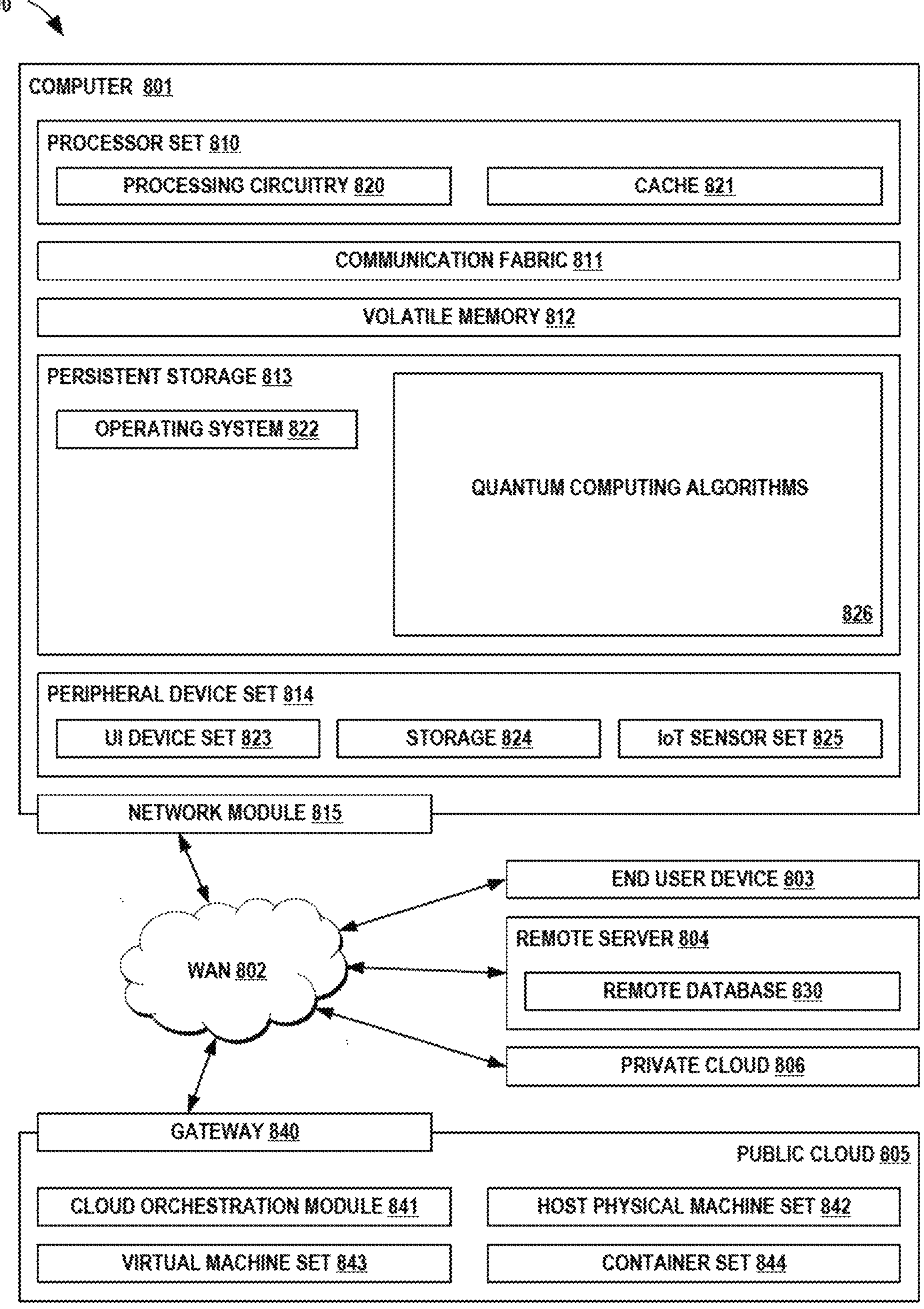
FIG. 8 schematically illustrates an exemplary architecture of a computing environment for hosting a quantum computing platform and performing quantum information processing, according to an exemplary embodiment of the disclosure.

In some exemplary embodiments, the quantum computing platform 710 of the quantum computing system 700 may be implemented using any suitable computing system architecture (e.g., as shown in FIG. 8) which is configured to implement methods to support quantum computing operations by executing computer readable program instructions that are embodied on a computer program product which includes a computer readable storage medium (or media) having such computer readable program instructions thereon for causing a processor to perform control methods as discussed herein.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 800 of FIG. 8 contains an example of an environment for the execution of at least some of the computer code (block 826) involved in executing quantum computing algorithms (e.g., quantum computing algorithms 712, FIG. 7). In addition to block 826, computing environment 800 includes, for example, computer 801, wide area network (WAN) 802, end user device (EUD) 803, remote server 804, public cloud 805, and private cloud 806. In this embodiment, computer 801 includes processor set 810 (including processing circuitry 820 and cache 821), communication fabric 811, volatile memory 812, persistent storage 813 (including operating system 822 and block 826, as identified above), peripheral device set 814 (including user interface (UI), device set 823, storage 824, and Internet of Things (IoT) sensor set 825), and network module 815. Remote server 804 includes remote database 830. Public cloud 805 includes gateway 840, cloud orchestration module 841, host physical machine set 842, virtual machine set 843, and container set 844.

Computer 801 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 830. As is well understood in the art of computer technology, and depending upon the technology, performance of a computer-implemented method may be distributed among multiple computers and/or between multiple locations. On the other hand, in this presentation of computing environment 800, detailed discussion is focused on a single computer, specifically computer 801, to keep the presentation as simple as possible. Computer 801 may be located in a cloud, even though it is not shown in a cloud in FIG. 8. On the other hand, computer

801 is not required to be in a cloud except to any extent as may be affirmatively indicated.

Processor set 810 includes one, or more, computer processors of any type now known or to be developed in the future. Processing circuitry 820 may be distributed over multiple packages, for example, multiple, coordinated integrated circuit chips. Processing circuitry 820 may implement multiple processor threads and/or multiple processor cores. Cache 821 is memory that is located in the processor chip package(s) and is typically used for data or code that should be available for rapid access by the threads or cores running on processor set 810. Cache memories are typically organized into multiple levels depending upon relative proximity to the processing circuitry. Alternatively, some, or all, of the cache for the processor set may be located "off chip." In some computing environments, processor set 810 may be designed for working with qubits and performing quantum computing.

Computer readable program instructions are typically loaded onto computer 801 to cause a series of operational steps to be performed by processor set 810 of computer 801 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 821 and the other storage media discussed below. The program instructions, and associated data, are accessed by processor set 810 to control and direct performance of the inventive methods. In computing environment 800, at least some of the instructions for performing the inventive methods may be stored in block 826 in persistent storage 813.

Communication fabric 811 is the signal conduction paths that allow the various components of computer 801 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 812 is any type of volatile memory now known or to be developed in the future. Examples include dynamic type random access memory (RAM) or static type RAM. Typically, the volatile memory is characterized by random access, but this is not required unless affirmatively indicated. In computer 801, the volatile memory 812 is located in a single package and is internal to computer 801, but, alternatively or additionally, the volatile memory may be distributed over multiple packages and/or located externally with respect to computer 801.

Persistent storage 813 is any form of non-volatile storage for computers that is now known or to be developed in the future. The non-volatility of this storage means that the stored data is maintained regardless of whether power is being supplied to computer 801 and/or directly to persistent storage 813. Persistent storage 813 may be a read only memory (ROM), but typically at least a portion of the persistent storage allows writing of data, deletion of data and re-writing of data. Some familiar forms of persistent storage include magnetic disks and solid-state storage devices. Operating system 822 may take several forms, such as various known proprietary operating systems or open source Portable Operating System Interface type operating systems that employ a kernel. The code included in block 826 typically includes at least some of the computer code involved in performing the inventive methods.

Peripheral device set 814 includes the set of peripheral devices of computer 801. Data communication connections between the peripheral devices and the other components of computer 801 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 823 may include components such as a display screen, speaker, microphone, wearable devices (such as goggles and smart watches), keyboard, mouse, printer, touchpad, game controllers, and haptic devices. Storage 824 is external storage, such as an external hard drive, or insertable storage, such as an SD card. Storage 824 may be persistent and/or volatile. In some embodiments, storage 824 may take the form of a quantum computing storage device for storing data in the form of qubits. In embodiments where computer 801 is required to have a large amount of storage (for example, where computer 801 locally stores and manages a large database) then this storage may be provided by peripheral storage devices designed for storing very large amounts of data, such as a storage area network (SAN) that is shared by multiple, geographically distributed computers. IoT sensor set 825 is made up of sensors that can be used in Internet of Things applications. For example, one sensor may be a thermometer and another sensor may be a motion detector.

Network module 815 is the collection of computer software, hardware, and firmware that allows computer 801 to communicate with other computers through WAN 802. Network module 815 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 815 are performed on the same physical hardware device. In other embodiments (for example, embodiments that utilize software-defined networking (SDN)), the control functions and the forwarding functions of network module 815 are performed on physically separate devices, such that the control functions manage several different network hardware devices. Computer readable program instructions for performing the inventive methods can typically be downloaded to computer 801 from an external computer or external storage device through a network adapter card or network interface included in network module 815.

WAN 802 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 803 is any computer system that is used and controlled by an end user (for example, a customer of an enterprise that operates computer 801), and may take any of the forms discussed above in connection with computer 801. EUD 803 typically receives helpful and useful data from the operations of computer 801. For example, in a hypothetical case where computer 801 is designed to provide a recommendation to an end user, this recommendation would typically be communicated from network module 815 of computer 801 through WAN 802 to EUD 803. In this way, EUD 803 can display, or otherwise present, the recommendation to an end user. In some embodiments, EUD 803 may be a client device, such as thin client, heavy client, mainframe computer, desktop computer and so on.

Remote server 804 is any computer system that serves at least some data and/or functionality to computer 801. Remote server 804 may be controlled and used by the same entity that operates computer 801. Remote server 804 represents the machine(s) that collect and store helpful and useful data for use by other computers, such as computer 801. For example, in a hypothetical case where computer 801 is designed and programmed to provide a recommendation based on historical data, then this historical data may be provided to computer 801 from remote database 830 of remote server 804.

Public cloud 805 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 805 is performed by the computer hardware and/or software of cloud orchestration module 841. The computing resources provided by public cloud 805 are typically implemented by virtual computing environments that run on various computers making up the computers of host physical machine set 842, which is the universe of physical computers in and/or available to public cloud 805. The virtual computing environments (VCEs) typically take the form of virtual machines from virtual machine set 843 and/or containers from container set 844. It is understood that these VCEs may be stored as images and may be transferred among and between the various physical machine hosts, either as images or after instantiation of the VCE. Cloud orchestration module 841 manages the transfer and storage of images, deploys new instantiations of VCEs and manages active instantiations of VCE deployments. Gateway 840 is the collection of computer software, hardware, and firmware that allows public cloud 805 to communicate through WAN 802.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 806 is similar to public cloud 805, except that the computing resources are only available for use by a single enterprise. While private cloud 806 is depicted as being in communication with WAN 802, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 805 and private cloud 806 are both part of a larger hybrid cloud.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:

a Josephson junction traveling-wave parametric circuit comprising unit cells which are coupled in series to form a transmission line between an input port and an output port, each unit cell comprising a series Josephson junction, and a capacitor shunted to ground;

wherein an impedance of the unit cells is varied along the transmission line to match an input impedance at the input port to an output impedance at the output port, wherein the input impedance and the output impedance are dissimilar.

2. The device of claim 1, wherein the Josephson junction traveling-wave parametric circuit comprises a Josephson traveling-wave frequency converter circuit.

3. The device of claim 1, wherein the Josephson junction traveling-wave parametric circuit comprises a Josephson traveling-wave parametric amplifier circuit.

4. A device, comprising:

a Josephson traveling-wave parametric amplifier circuit comprising unit cells which are coupled in series to form a transmission line between an input port and an output port, each unit cell comprising a series Josephson junction, and a capacitor shunted to ground;

wherein an impedance of the unit cells is varied along the transmission line to cause the transmission line to have an increased effective electrical length compared to an unvaried impedance.

5. The device of claim 4, wherein the impedance of successive unit cells along at least a portion of the transmission line is varied exponentially with respect to electrical length.

6. The device of claim 4, wherein the impedance of the unit cells is varied along the transmission line by varying a capacitance of the capacitors of the unit cells.

7. The device of claim 4, wherein the impedance of the unit cells is varied along the transmission line by varying a critical current of the Josephson junctions of the unit cells.

8. The device of claim 4, wherein the impedance of the unit cells is varied along the transmission line by progressively decreasing the impedance of unit cells along a first portion of the transmission line and progressively increasing the impedance of unit cells along a second portion of the transmission line.

9. The device of claim 8, wherein:

the first portion of the transmission line extends from the input port to a central region of the transmission line; and the second portion of the transmission line extends from the central region of the transmission line to the output port.

10. The device of claim 9, wherein the central region of the transmission line comprises a plurality of unit cells providing a constant impedance over the central region of the transmission line.

11. The device of claim 4, wherein the impedance of the unit cells is varied along the transmission line by progressively increasing the impedance of the unit cells along the transmission line from the input port to the output port.

12. The device of claim 4, wherein the impedance of the unit cells is varied along the transmission line to match dissimilar impedances at the input port and the output port of the Josephson traveling-wave parametric amplifier circuit.

13. The device of claim 4, wherein the Josephson traveling-wave parametric amplifier circuit comprises a plurality of dispersion resonators that are coupled to different points along the transmission line using respective coupling capacitors.

14. The device of claim 4, wherein the Josephson traveling-wave parametric amplifier circuit is configured to perform four-wave mixing of a signal and pump tone applied to the input port.

15. The device of claim 4, wherein the Josephson traveling-wave parametric amplifier circuit comprises less than 1200 unit cells.

16. A system, comprising:

a quantum processor comprising quantum bits; and a readout signal path configured to transmit signals that are readout from one or more of the quantum bits of the quantum processor, the readout signal path comprising a Josephson traveling-wave parametric amplifier circuit;

wherein the Josephson traveling-wave parametric amplifier circuit comprises unit cells which are coupled in series to form a transmission line between an input port and an output port, each unit cell comprising a series Josephson junction, and a capacitor shunted to ground; and wherein an impedance of the unit cells is varied along the transmission line to cause the transmission line to have an increased effective electrical length compared to an unvaried impedance.

17. The system of claim 16, wherein the impedance of the unit cells is varied along the transmission line by varying a capacitance of the capacitors of the unit cells.

18. The system of claim 16, wherein the impedance of the unit cells is varied along the transmission line by varying a critical current of the Josephson junctions of the unit cells.

19. The system of claim 16, wherein the impedance of the unit cells is varied along the transmission line by progressively decreasing the impedance of the unit cells along a first portion of the transmission line and progressively increasing the impedance of the unit cells along a second portion of the transmission line.

20. The system of claim 16, wherein the impedance of the unit cells is varied along the transmission line to match dissimilar impedances at the input port and the output port of the Josephson traveling-wave parametric amplifier circuit.

* * * * *